United States Patent
Long et al.

(10) Patent No.: US 11,579,810 B2
(45) Date of Patent: Feb. 14, 2023

(54) SEMICONDUCTOR MEMORY TRAINING METHOD AND RELATED DEVICE

(71) Applicant: CHANGXIN MEMORY TECHNOLOGIES, INC., Hefei (CN)

(72) Inventors: Guangteng Long, Hefei (CN); Xiaofeng Xu, Hefei (CN); Yang Wang, Hefei (CN); Peng Wang, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 0 days.

(21) Appl. No.: 17/434,105

(22) PCT Filed: Mar. 9, 2021

(86) PCT No.: PCT/CN2021/079813
§ 371 (c)(1),
(2) Date: Aug. 26, 2021

(87) PCT Pub. No.: WO2021/203895
PCT Pub. Date: Oct. 14, 2021

(65) Prior Publication Data
US 2022/0147278 A1    May 12, 2022

(30) Foreign Application Priority Data
Apr. 8, 2020  (CN) .......................... 202010270898.X

(51) Int. Cl.
*G06F 3/06* (2006.01)
*G11C 11/401* (2006.01)

(52) U.S. Cl.
CPC .......... *G06F 3/0659* (2013.01); *G06F 3/0604* (2013.01); *G06F 3/0673* (2013.01); *G11C 11/401* (2013.01)

(58) Field of Classification Search
CPC .... G06F 3/0659; G06F 3/0604; G06F 3/0673; G06F 3/0653; G06F 3/0679;
(Continued)

(56) References Cited

U.S. PATENT DOCUMENTS 3,800,280 A * 3/1974 Heffner ................. G11B 20/20
8,432,737 B2   4/2013 Shiga
(Continued)

FOREIGN PATENT DOCUMENTS

CN   102163980 A   8/2011
CN   102681868 A   9/2012
(Continued)

OTHER PUBLICATIONS

English translation of International Search Report and Written Opinion dated Jul. 6, 2021, 9 pages.
International Search Report dated Jul. 6, 2021, 9 pages.

*Primary Examiner* — Charles Rones
*Assistant Examiner* — Tong B. Vo
(74) *Attorney, Agent, or Firm* — Cooper Legal Group, LLC

(57) ABSTRACT

The present application relates to a semiconductor memory training method and related devices, belonging to the technical field of semiconductors. The method comprises: obtaining a stored historical training result of a semiconductor memory, the historical training result comprising a historical expected delay value and a historical expected voltage; setting a delay threshold and a current training voltage range, the delay threshold being less than or equal to the historical expected delay value, the current training voltage range comprising the historical expected voltage; obtaining a current minimum delay value for the semiconductor memory under the historical expected voltage; and using the stored historical training result as a current training result of the semiconductor memory, if the current minimum delay value for the semiconductor memory under the historical expected voltage is no less than the delay threshold.

18 Claims, 7 Drawing Sheets

(58) Field of Classification Search
CPC ....... G06F 3/0626; G11C 11/401; G11C 5/14;
G11C 29/10; G11C 29/50; G11C 5/147;
G11C 2029/5004
See application file for complete search history.

(56) References Cited

U.S. PATENT DOCUMENTS

| | | | |
|---|---|---|---|
| 8,543,801 B2 | 9/2013 | Chu et al. | |
| 9,666,264 B1* | 5/2017 | Jeter | G06F 13/4234 |
| 9,811,273 B1* | 11/2017 | Brahmadathan | G06F 11/1068 |
| 10,943,183 B2 | 3/2021 | Cha | |
| 11,200,941 B2* | 12/2021 | Park | G11C 11/4076 |
| 2008/0130986 A1* | 6/2008 | Bae | G11C 29/02 |
| | | | 382/159 |
| 2012/0191964 A1 | 7/2012 | Lee et al. | |
| 2019/0250851 A1* | 8/2019 | Kankani | G06F 3/0679 |
| 2020/0042209 A1* | 2/2020 | Morris | G06F 3/0659 |
| 2021/0181976 A1* | 6/2021 | Papagianni | G06F 3/068 |
| 2022/0035572 A1* | 2/2022 | Tai | G06F 3/0619 |

FOREIGN PATENT DOCUMENTS

| | | |
|---|---|---|
| CN | 103502964 A | 1/2014 |
| CN | 107621959 A | 1/2018 |
| CN | 108196177 A | 6/2018 |
| CN | 109754841 A | 5/2019 |
| TW | I474260 B | 2/2015 |

* cited by examiner

SEMICONDUCTOR MEMORY TRAINING METHOD AND RELATED DEVICE

CROSS REFERENCE TO RELATED APPLICATIONS

The present application claims the priority to Chinese Patent Application 202010270898.X, titled "Semiconductor memory training method and related device", filed on Apr. 8, 2020, which is incorporated herein by reference in its entirety.

TECHNICAL FIELD

The present application relates to the technical field of semiconductors, and in particular, to a semiconductor memory training method, a semiconductor memory training apparatus, an electronic device, and a computer-readable storage medium.

BACKGROUND

The current semiconductor memory need to be trained to meet normal operating requirements. The training of semiconductor memory is an indispensable part of the system startup stage. There are many training types for semiconductor memory, for example CA (Command Address) training, write training, etc.

For each training type, it is necessary to find out the margin of the maximum operating range within a certain voltage range. The speed of training determines the speed of system startup.

It is to be noted that the information disclosed in the background section is only provided to facilitate the understanding of the background of the present application, and therefore may include information that does not constitute the existing technologies known to a person of ordinary skill in the art.

SUMMARY

The purpose of the present application is to provide a semiconductor memory training method, a semiconductor memory training apparatus, an electronic device and a computer-readable storage medium, which can reduce the time for training semiconductor memory, in order to overcome the above-mentioned shortcomings in the prior art.

According to an aspect of the present application, there is provided a semiconductor memory training method, comprising: obtaining a stored historical training result of a semiconductor memory, the historical training result comprising a historical expected delay value and a historical expected voltage; setting a delay threshold and a current training voltage range, the delay threshold being less than or equal to the historical expected delay value, the current training voltage range comprising the historical expected voltage; obtaining a current minimum delay value for the semiconductor memory under the historical expected voltage; and using the stored historical training result as a current training result of the semiconductor memory, if the current minimum delay value for the semiconductor memory under the historical expected voltage is no less than the delay threshold.

According to an aspect of the present application, there is provided a semiconductor memory training apparatus, comprising: a historical training result obtaining unit, configured to obtain the stored historical training result, the historical training result comprising a historical expected delay value and a historical expected voltage; a threshold voltage range setting unit, configured to set a delay threshold and a current training voltage range, the delay threshold being less than or equal to the historical expected delay value, the current training voltage range comprising the historical expected voltage; a current minimum delay obtaining unit, configured to obtain a current minimum delay value for the semiconductor memory under the historical expected voltage; and a current training result determination unit, configured to use the stored historical training result as a current training result of the semiconductor memory if the current minimum delay value under the historical expected voltage is no less than the delay threshold.

According to an aspect of the present application, there is provided an electronic device, comprising: one or more processors; and a storage apparatus, configured to store one or more programs; when the one or more programs are executed by the one or more processors, the one or more processors implement the method in any embodiment of the present application.

According to an aspect of the present application, there is provided a computer-readable storage medium having computer programs stored thereon that, when the computer programs are executed by processors, the processors implement the method in any embodiment of the present application.

It should be understood that the aforementioned general description and following detailed description are merely exemplary and explanatory, and the present application is not limited thereto.

BRIEF DESCRIPTION OF THE DRAWINGS

The drawings herein are incorporated into the specification and constitute a part of the specification. The drawings show embodiments of the present application, and explain, together with the specification, the principle of the present application. Apparently, the drawings to be used in the following description show only some embodiments of the present application. For a person of ordinary skill in the art, other drawings may be obtained according to these drawings, without paying any creative effort.

DETAILED DESCRIPTION OF THE EMBODIMENTS

Figure 1:
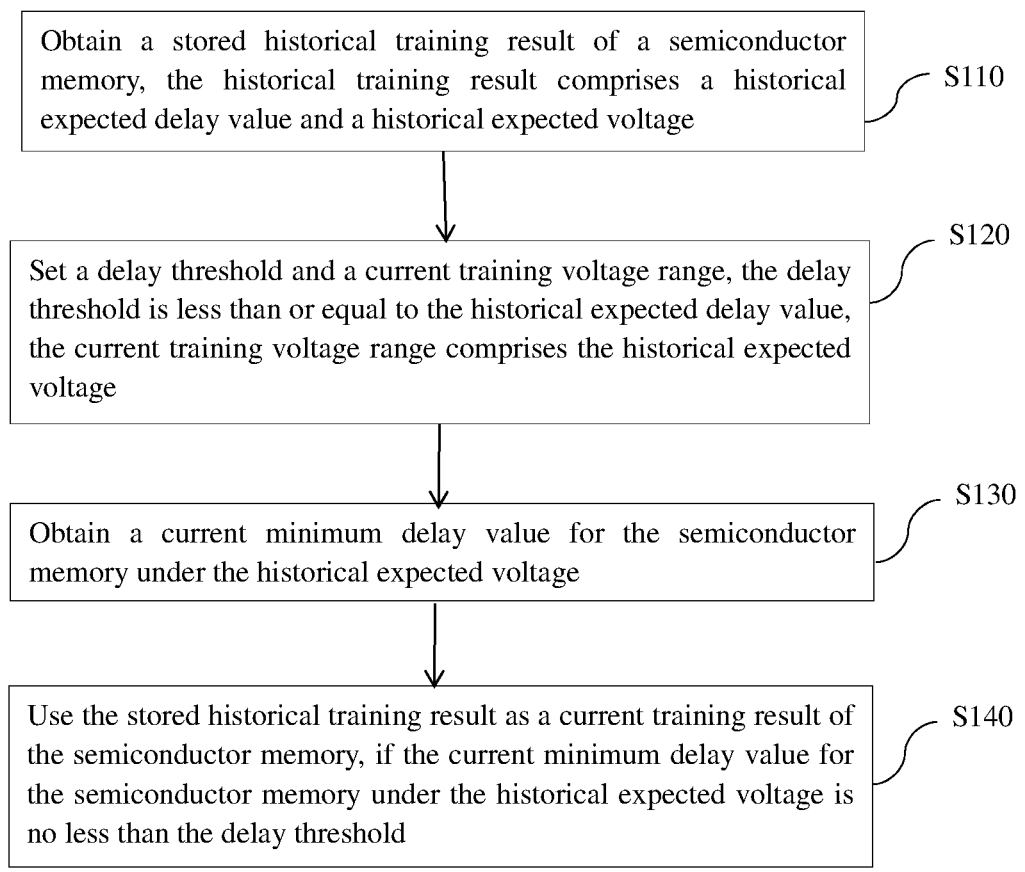
FIG. 1 schematically shows a flowchart of a semiconductor memory training method according to an embodiment of the present application.

Exemplary implementations will now be described more fully with reference to the accompanying drawings. However, the exemplary implementations may be implemented in various forms, and should not be construed as being limited to the examples set forth herein; instead, these implementations are provided to make the present application more comprehensive and complete, and to fully convey the concepts of the exemplary implementations to those skilled in the art.

In addition, the described features, structures or characteristics may be combined in one or more embodiments in any suitable way. In the following description, many specific details are provided to give a sufficient understanding of the embodiments of the present application. However, it will be realized by those skilled in the art that the technical solutions of the present application may be practiced without one or more of the specific details, or other methods, components, apparatuses, steps, etc. may be used. In other cases, the well-known methods, apparatuses, implementations or operations will not be shown or described in detail in order to avoid obscuring aspects of the present application.

The block diagrams shown in the drawings are merely functional entities, and do not necessarily correspond to physically independent entities. That is, these functional entities may be implemented in the form of software, or implemented in one or more hardware modules or integrated circuits, or implemented in different networks and/or processor apparatuses and/or microcontroller apparatuses.

The flowchart shown in the drawings is merely an exemplary description, and does not necessarily comprise all contents and operations/steps, nor does it have to be executed in the described order. For example, some operations/steps may be decomposed, and some operations/steps may be combined or partially combined, so the actual execution order may be changed according to actual conditions.

Although relative terms such as "upper" and "lower" are used in this specification to describe the relative relationship between one component and another component, these terms are used in this specification just for convenience, for example, in the direction as shown in the drawings. It may be understood that, if an apparatus as shown is turned upside down, the component described as "upper" will become the "lower" component. When a structure is arranged "on" other structures, it may mean that the structure is integrally formed on the other structures, or that the structure is "directly" arranged on the other structures, or that the structure is "indirectly" arranged on the other structures through another structure.

The terms "a", "an", "the", "said" and "at least one" are used to indicate the presence of one or more elements/constituent parts/etc.; the terms "comprising" and "having" are used to indicate non-exclusive inclusion and indicate the presence of other elements/constituent parts/etc. in addition to the listed elements/constituent parts/etc.; and the terms "first" and "second" are used only as marks, rather than limiting the number of objects.

Due to the increase in the operating frequency of semiconductor memory, the range of fault tolerance between signals has become very small. If the signals are not trained to meet the corresponding delay requirements, the semiconductor memory cannot operate normally. The training of semiconductor memory is an indispensable part of the initialization of semiconductor memory. Before the training is completed, the semiconductor memory cannot be initialized, and the system data and codes cannot be loaded to the semiconductor memory. Therefore, the speed of training semiconductor memory determines the speed of system startup.

FIG. 1 schematically shows a flowchart of a semiconductor memory training method according to an embodiment of the present application. In an embodiment of the present application, the semiconductor memory may be any type of semiconductor memory, for example, DDR SDRAM (Double Data Rate Synchronous Dynamic Random Access Memory). In the following examples, LPDDR 4 (Low Power DDR SDRAM) will be used as an example for illustration. However, the present application is not limited thereto, and the semiconductor memory may be any type of memory.

In an embodiment of the present application, the semiconductor memory may comprise a plurality of target signal lines, and each target signal line may have a plurality of reference voltages within a target voltage reference range.

The target signal lines in an embodiment of the present application may be, for example, any one or more of command signal lines (CA signal lines for short, which correspond to CA signals), data signal lines (which correspond to data signals), etc., of a semiconductor memory. In the following examples, six CA signal lines (labeled as CA0-CA5) of LPDDR 4 are taken as examples of the plurality of target signal lines. The training process of other signal lines is similar.

The command or data signals have a corresponding voltage reference range. For example, it is stipulated in the JEDEC (Joint Electron Device Engineering Council) standard that the LPDDR4 CA signals has two voltage reference ranges: Range[0]: 10.0%-30.0% of $V_{DD2}$; and Range[1]: 22.0%-42.0% of $V_{DD2}$, both having a step size of 0.4%. The two voltage reference ranges overlap partially, as shown in Table 1. That is, the two ranges have total 81 reference voltages (102 (total)−21 (overlapped)=81).

In the following examples, the description will be given by using, as an example, the Range[0] and Range[1] as the target voltage reference ranges and the 81 reference voltages in the two ranges as the plurality of reference voltages. However, it should be noted that different protocols have different voltage reference ranges and step sizes. Therefore, the embodiments of the present application are not limited to the above examples.

TABLE 1

| Function | Operand | Range[0] Values(% of $V_{DD2}$) | | Range[1] Values(% of $V_{DD2}$) | | Notes |
|---|---|---|---|---|---|---|
| Set the $V_{REF}$ for MR12 | OP[5:0] | $000000_B$: 10.0% | $011010_B$: 20.4% | $000000_B$: 22.0% | $011010_B$: 32.4% | 1, 2, 3 |
| | | $000001_B$: 10.4% | $011011_B$: 20.8% | $000001_B$: 22.4% | $011011_B$: 32.8% | |
| | | $000010_B$: 10.8% | $011100_B$: 21.2% | $000010_B$: 22.8% | $011100_B$: 33.2% | |
| | | $000011_B$: 11.2% | $011101_B$: 21.6% | $000011_B$: 23.2% | $011101_B$: 33.6% | |
| | | $000100_B$: 11.6% | $011110_B$: 22.0% | $000100_B$: 23.6% | $011110_B$: 34.0% | |
| | | $000101_B$: 12.0% | $011111_B$: 22.4% | $000101_B$: 24.0% | $011111_B$: 34.4% | |
| | | $000110_B$: 12.4% | $100000_B$: 22.8% | $000110_B$: 24.4% | $100000_B$: 34.8% | |
| | | $000111_B$: 12.8% | $100001_B$: 23.2% | $000111_B$: 24.8% | $100001_B$: 35.2% | |
| | | $001000_B$: 13.2% | $100010_B$: 23.6% | $001000_B$: 25.2% | $100010_B$: 35.6% | |
| | | $001001_B$: 13.6% | $100011_B$: 24.0% | $001001_B$: 25.6% | $100011_B$: 36.0% | |
| | | $001010_B$: 14.0% | $100100_B$: 24.4% | $001010_B$: 26.0% | $100100_B$: 36.4% | |
| | | $001011_B$: 14.4% | $100101_B$: 24.8% | $001011_B$: 26.4% | $100101_B$: 36.8% | |
| | | $001100_B$: 14.8% | $100110_B$: 25.2% | $001100_B$: 26.8% | $100110_B$: 37.2% | |
| | | $001101_B$: 15.2% | $100111_B$: 25.6% | $001101_B$: 27.2% (default) | $100111_B$: 37.6% | |
| | | $001110_B$: 15.6% | $101000_B$: 26.0% | $001110_B$: 27.6% | $101000_B$: 38.0% | |
| | | $001111_B$: 16.0% | $101001_B$: 26.4% | $001111_B$: 28.0% | $101001_B$: 38.4% | |
| | | $010000_B$: 16.4% | $101010_B$: 26.8% | $010000_B$: 28.4% | $101010_B$: 38.8% | |
| | | $010001_B$: 16.8% | $101011_B$: 27.2% | $010001_B$: 28.8% | $101011_B$: 39.2% | |
| | | $010010_B$: 17.2% | $101100_B$: 27.6% | $010010_B$: 29.2% | $101100_B$: 39.6% | |
| | | $010011_B$: 17.6% | $101101_B$: 28.0% | $010011_B$: 29.6% | $101101_B$: 40.0% | |
| | | $010100_B$: 18.0% | $101110_B$: 28.4% | $010100_B$: 30.0% | $101110_B$: 40.4% | |
| | | $010101_B$: 18.4% | $101111_B$: 28.8% | $010101_B$: 30.4% | $101111_B$: 40.8% | |
| | | $010110_B$: 18.8% | $110000_B$: 29.2% | $010110_B$: 30.8% | $110000_B$: 41.2% | |
| | | $010111_B$: 19.2% | $110001_B$: 29.6% | $010111_B$: 31.2% | $110001_B$: 41.6% | |
| | | $011000_B$: 19.6% | $110010_B$: 30.0% | $011000_B$: 31.6% | $110010_B$: 42.0% | |
| | | $011001_B$: 20.0% | All others: reserved | $011001_B$: 32.0% | All others: reserved | |

In an embodiment of the present application, it is assumed that the currently tested semiconductor memory has 6 command signal lines and 8 or 16 data signal lines (which may be different for different protocols). In CA training, it is necessary to obtain a maximum value (that is, the expected delay value) among minimum values in the operating delay range of the six command signal lines CA0-CA5 under each reference voltage (for example, minimum delay values for the six command signal lines under the 81 reference voltages). It is two-dimensional training because there are two variables: the voltage reference range and the operating delay value.

In the related art, in the training process, first, the minimum delay values minDelay for all CA signals under a reference voltage are obtained as the training result of this reference voltage; and then, the minimum delay values minDelay for all CA signals under a next reference voltage are obtained as the training result of the next reference voltage. This step is repeated until all reference voltages are traversed. Then, under all reference voltages, the maximum value among all minimum delay values in the training result is used as the final training result of the semiconductor memory.

For example, for each CA signal in the six CA signal lines, it is needed to test the delay under 81 reference voltages in sequence. It is assumed that the initial delay range is 0-1023 and that the actual operating delay range of a CA signal line that is currently tested is [104,706], where 104 is the left margin value and 706 is the right margin value, then the process of obtaining the operating delay range of this CA signal line under a reference voltage comprises: starting from 0, adding the delay by 1 each time to determine whether this CA signal line can operate normally. It is found that this CA signal line can still operate normally at the delay 706, but this CA signal line cannot operate normally at the delay 707. Therefore, a total of the right margin value+ 2=708 determinations are required to determine that the right margin value for this CA signal line is 706. The sum of time required for "right margin value+2" determinations is the test time to obtain the operating delay range for this CA signal line.

By this method, the test time of each of the 6 CA signal lines under 81 reference voltages is calculated respectively, and then the 6*81 test time is accumulated to obtain the total test time of the 6 CA signal lines. From this, it may be known that the training method used in the related technologies needs to traverse all reference voltages and delays, resulting in a very large amount of calculation. It is quite time-consuming and thus leads to long training time that in turn affects the speed of system startup.

Since the operating delay of the semiconductor memory may be affected by the current operating temperature and operating voltage of the semiconductor memory, the training result of the semiconductor memory may vary. Meanwhile, during the operation, the semiconductor memory controller may decide to retrain the semiconductor memory according to the current operating temperature or operating voltage. Therefore, an embodiment of the present application provides a semiconductor memory retraining method based on the memory value (the stored historical training result). For example, the semiconductor memory is trained when powered-on and the training result obtained when powered-on is stored as the historical training result; and then, during the operation of the semiconductor memory, as the current operating temperature or operating voltage of the semiconductor memory changes, the semiconductor memory is retrained. The retraining may be based on the stored historical training result to reduce the training time.

As shown in FIG. 1, the semiconductor memory training method according to an embodiment of the present application may comprise the following steps.

In the step S110, the stored historical training result of a semiconductor memory is obtained, the historical training result comprising a historical expected delay value minDelay and a historical expected voltage tVref.

In an embodiment of the present application, the historical training result may be stored in any non-volatile memory.

In an embodiment of the present application, the expected delay value is the maximum delay value among the minimum delay values for target signal lines of the semiconductor memory under reference voltages. For example, taking the target signal line comprising CA0-CA5 as an example, the expected delay value is the maximum delay value among the minimum delay values for CA0-CA5 under 81 reference voltages. That is, it is assumed that the minimum delay values for CA0-CA5 under the $j^{th}$ reference voltage are $curVal_j=min(leftVal_{0j}, leftVal_{1j}, leftVal_{2j}, leftVal_{3j}, leftVal_{4j}, leftVal_{5j})$, then the expected delay value is $max(curVal_0, curVal_1, curVal_2, curVal_3, curVal_4, curVal_5, curVal_6, curVal_7, curVal_8, \ldots, curVal_{80})$. Note that, this refers to the meaning of the expected delay value, not the manner in which the expected delay value is obtained in the embodiments of the present application. The expected voltage is the reference voltage corresponding to the expected delay value.

In an embodiment of the present application, the historical expected delay value and the historical expected voltage are the expected delay value and the corresponding reference voltage in the training result previously obtained by training the semiconductor memory. For example, the historical expected delay value and the historical expected voltage may be the expected delay value and the corresponding reference voltage in the training result obtained by training the semiconductor memory when powered-on, or may be the expected delay value and the corresponding reference voltage in the training result obtained by performing the previous training on the semiconductor memory before the current time, or possibly may be the expected delay value and the corresponding reference voltage in the training result obtained by performing any training on the semiconductor memory before the current time. This is not limited in the present application.

In the step S120, a delay threshold and a current training voltage range are set, the delay threshold being less than or equal to the historical expected delay value, the current training voltage range comprising the historical expected voltage.

In the following examples, M represents the set delay threshold, M is a real number greater than 0, and M<=historical expected delay value minDelay. The value of M may be set according to actual needs, which is not limited in the present application. For example, if high requirements are proposed on the training result of the semiconductor memory, M may be set in a large value, and if low requirements are proposed on the training result, M may be set in a relatively small value.

In an embodiment of the present application, the current training voltage range comprises the historical expected voltage tVref. Since the operating delay of the semiconductor memory is influenced by the current operating temperature and operating voltage of the semiconductor memory, that is, the relationship curve between the delay of semiconductor memory and the reference voltage will have an offset, if the current operating temperature and operating voltage of the semiconductor memory have great influence on the offset of the relationship curve, a large current training voltage range may be set; and if they have less influence on the offset of the relationship curve, a relatively small current training voltage range may be set. That is, the current training voltage range may be set according to actual needs.

In the step S130, a current minimum delay value for the semiconductor memory under the historical expected voltage is obtained.

In an embodiment of the present application, when the operating temperature or operating voltage of the semiconductor memory changes, it is decided to train the semiconductor memory again to obtain the current minimum delay value tDelay for the semiconductor memory under the historical expected voltage tVref, that is, the minimum value among all minimum delay values for all target signal lines of the semiconductor memory under the historical expected voltage tVref.

In the step S140, the stored historical training result is used as a current training result of the semiconductor memory, if the current minimum delay value for the semiconductor memory under the historical expected voltage is no less than the delay threshold.

In an embodiment of the present application, if the current minimum delay value tDelay under the historical expected voltage tVref is no less than the delay threshold M set above, it is indicated that the relationship curve of the delay and the reference voltage just has a small offset when the semiconductor memory is at the current operating temperature or operating voltage. In this case, the influence of the current operating temperature or operating voltage change may be ignored, and the stored historical training result is still used as the current training result of the semiconductor memory. That is, the historical expected delay value is used as the current expected time delay value and the historical expected voltage is used as the current expected voltage. In this case, there is no need to update the historical training result, and the original historical training result in the non-volatile memory may be maintained.

With regard to the semiconductor memory training method in the implementation of the present application, the stored historical training result of a semiconductor memory is obtained, the historical training result comprising a historical expected delay value and a historical expected voltage; then a delay threshold less than or equal to the historical expected delay value is set; and a current training voltage range is set according to the historical expected voltage, the current training voltage range comprising the historical expected voltage. In this way, when it is necessary to retrain the semiconductor memory, the current minimum delay value for the semiconductor memory under the historical expected voltage can be obtained. If the current minimum delay value for the semiconductor memory under the historical expected voltage is no less than the delay threshold, the stored historical training result can be directly used as the current training result of the semiconductor memory. Thus, the training efficiency of the semiconductor memory can be improved, and the time for training the semiconductor memory can be reduced. Therefore, the speed of system startup can be increased.

Figure 2:
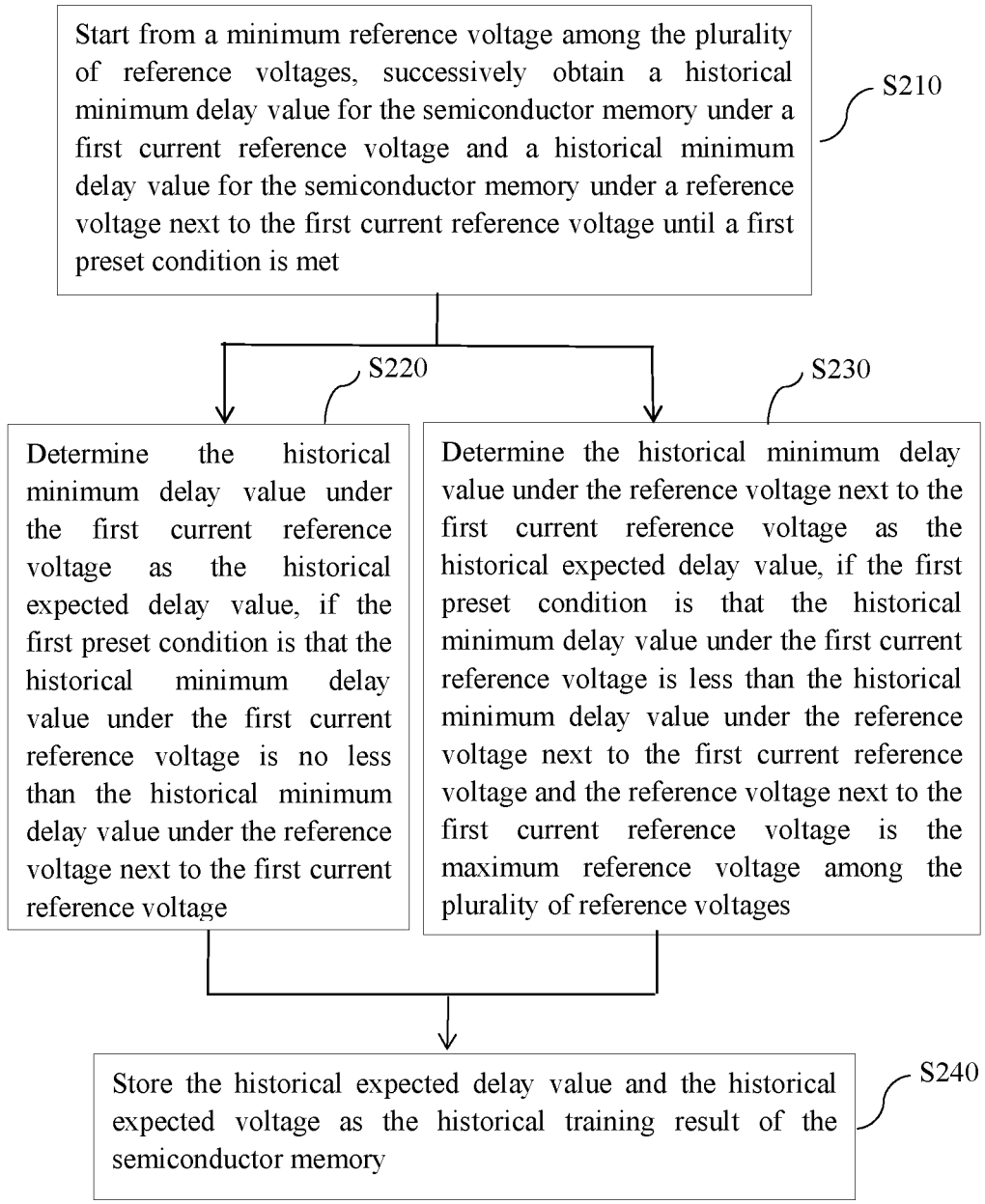
FIG. 2 schematically shows a flowchart of a semiconductor memory training method according to an embodiment of the present application.

FIG. 2 schematically shows a flowchart of a semiconductor memory training method according to an embodiment of the present application. The embodiment of FIG. 2 exemplarily shows a method for generating and storing a historical training result. It should be noted that the test time in the embodiment of FIG. 2 is prior to the current time. In the embodiment of FIG. 2, the semiconductor memory has a plurality of reference voltages (81 reference voltages in the following examples).

Figure 3:
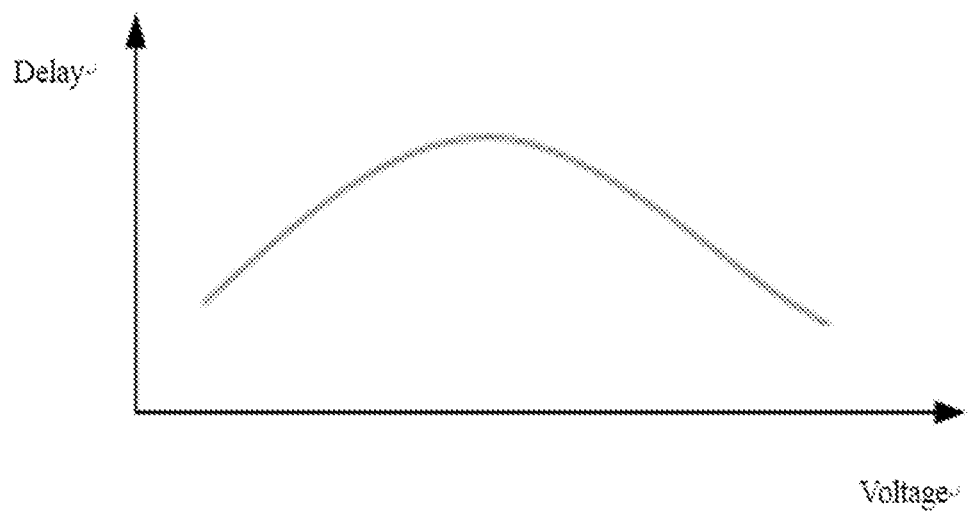
FIG. 3 schematically shows a schematic diagram of normal distribution of reference voltages and delay values according to an embodiment of the present application.
Figure 4:
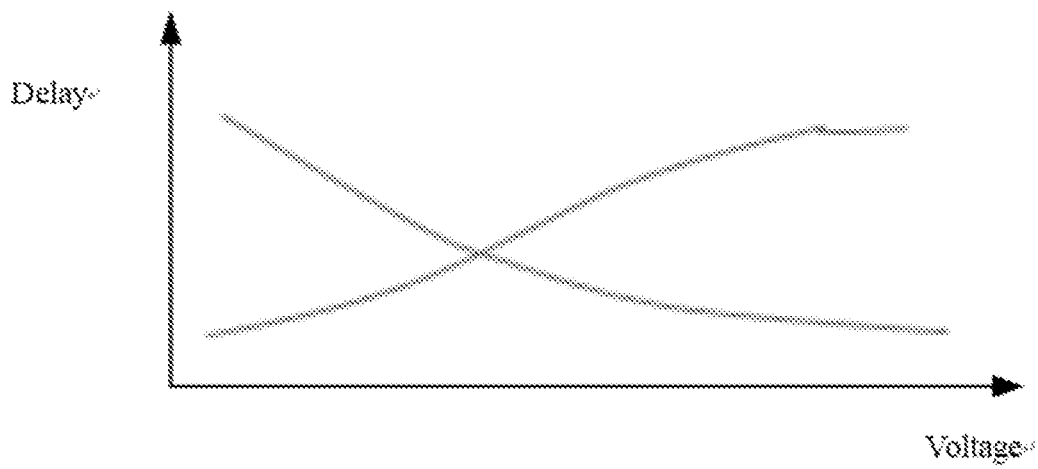
FIG. 4 schematically shows a schematic diagram of increasing or decreasing distribution of reference voltages and delay values according to an embodiment of the present application.

After the minimum delay value for each target signal line under each reference voltage is obtained, the minimum value among the minimum delay values for all target signal lines may be obtained. Due to the operating nature of semiconductor memory, under each reference voltage, the minimum value among the minimum delay values for all target signal lines is generally in the form of normal distribution (as shown in FIG. 3), increases with the increase of the reference voltage, or decreases with the increase of the reference voltage (as shown in FIG. 4). However, it is impossible to know in advance the exact form, because the semiconductor memory may be different. It may be determined by the method according to the embodiment of the present application.

As shown in FIG. 2, before obtaining the stored historical training result, the method in an embodiment of the present application may further comprise the following steps.

In the step S210, starting from a minimum reference voltage among the plurality of reference voltages, a historical minimum delay value for the semiconductor memory under a first current reference voltage and a historical minimum delay value for the semiconductor memory under a reference voltage next to the first current reference voltage are successively obtained until a first preset condition is met.

For example, the 81 reference voltages are sorted in an ascending order, the leftmost reference voltage is the minimum reference voltage, and the rightmost reference voltage is the maximum reference voltage. Starting from the minimum reference voltage among the 81 reference voltages, i.e., the first current reference voltage, first, the minimum value among all the minimum delay values for all target signal lines under the minimum reference voltage is obtained as the historical minimum delay value minVal under the first current reference voltage; and then, the minimum value among all the minimum delay values for all target signal lines under a reference voltage next to the minimum reference voltage (that is, the second reference voltage among the 81 reference voltages) is obtained as the historical minimum delay value curVal under the reference voltage next to the first current reference voltage.

In the step S220, the historical minimum delay value under the first current reference voltage is determined as the historical expected delay value, if the first preset condition is that the historical minimum delay value under the first current reference voltage is no less than the historical minimum delay value under the reference voltage next to the first current reference voltage.

For example, if the historical minimum delay value minVal under the minimum reference voltage is no less than the historical minimum delay value curVal under the second reference voltage, it may be determined that this is a case where the minimum value among the minimum delay values for all the target signal lines in FIG. 4 decreases with the increase of the reference voltage. In this case, the historical expected delay value and the historical expected voltage may be obtained by only one test. That is, the minimum reference voltage is the historical expected voltage, and the historical minimum delay value minVal under the minimum reference voltage is the historical expected delay value.

If the historical minimum delay value minVal under the minimum reference voltage is less than the historical minimum delay value curVal under the second reference voltage, it may be determined that this is the normal distribution as shown in FIG. 3 or this is a case where the minimum value among the minimum delay values for all the target signal lines in FIG. 4 increases with the increase of the reference voltage. In this case, the second reference voltage may be still used as the first current reference voltage, and updated with the historical minimum delay value curVal under the second reference voltage to become the historical minimum delay value minVal under the first current reference voltage; and, by using a reference voltage next to the second reference voltage (i.e., a third reference voltage) as the reference voltage next to the first current reference voltage, the minimum value among the minimum delay values for all target signal lines under the third reference voltage is obtained as the historical minimum delay value curVal under the reference voltage next to the first current reference voltage. This step is repeated. If it is found for the first time that the historical minimum delay value minVal under the first current reference voltage at a certain moment of time is no less than the historical minimum delay value curVal under the reference voltage next to the first current reference voltage at this moment of time, it may be determined that this is the normal distribution as shown in FIG. 3. Furthermore, at this moment of time, the historical minimum delay value minVal under the first current reference voltage is the maximum value among all the minimum delay values in this normal distribution form (i.e., the peak in FIG. 3), that is, the historical expected delay value. The first current reference voltage at this moment of time is the historical expected voltage.

In the step S230, the historical minimum delay value under the reference voltage next to the first current reference voltage is determined as the historical expected delay value, if the first preset condition is that the historical minimum delay value under the first current reference voltage is less than the historical minimum delay value under the reference voltage next to the first current reference voltage, and the reference voltage next to the first current reference voltage is the maximum reference voltage among the plurality of reference voltages.

For example, if it is failed to find for the first time that, by repeating this step again and again, the historical minimum delay value minVal under the first current reference voltage at a certain moment of time is no less than the historical minimum delay value curVal under the reference voltage next to the first current reference voltage at this moment of time, until the first current reference voltage becomes the 80th reference voltage among the 81 reference voltages and the reference voltage next to the first current reference voltage becomes the $81^{st}$ reference voltage among the 81 reference voltages (i.e., the maximum reference voltage), and if, in this case, the historical minimum delay value under the first current reference voltage is less than the historical minimum delay value under the reference voltage next to the first current reference voltage, it may be determined that this is a case where the minimum value among the minimum delay values for all the target signal lines in FIG. 4 increases with the increase of the reference voltage. In this case, the maximum reference voltage among the 81 reference voltages is the historical expected voltage, and the corresponding historical minimum delay value is the historical expected delay value.

In the step S240, the historical expected delay value and the historical expected voltage are stored as the historical training result of the semiconductor memory.

The historical expected delay value is labeled as minDelay and the historical expected voltage is labeled as tVref, both of which are stored in any non-volatile memory.

It should be noted that the embodiment of FIG. 2 starts from the minimum reference voltage, as the first current reference voltage, among the reference voltages sorted in an ascending order. However, the present application is not limited thereto. For example, a plurality of reference voltages may be sorted in a descending order, and this step starts from the maximum reference voltage as the first current reference voltage.

As described in the embodiment of FIG. 2, it is possible to obtain the most accurate historical expected delay value and historical expected voltage during historical training (for example, the first training of the semiconductor memory when powered-on). However, the method for obtaining the training result in the present application is not limited to the methods exemplified in FIG. 2. For example, it is possible to determine whether the reference voltage corresponding to the historical expected delay value, i.e., the historical expected voltage, is on the left or right of any one of the currently selected 81 reference voltages, then reduce the search range according to a large step size, and then precisely search the reference voltage according to a small step size. In this way, the retrieval of the historical expected delay value can be speeded up, the training time can be reduced, the training effect can be improved, and the accuracy of the training result can be ensured.

For example, any one of the 81 reference voltages may be labeled as midVref. The following is an example of how to obtain the operating delay range of each target signal line under each reference voltage. Taking CA0 as an example, it is assumed that the initial delay range of CA0 under midVref is 0-1023, and that the operating delay range of CA0 under midVref is actually [104,706]. It should be noted that this is merely exemplary, and the actual initial delay range and operating delay range may be determined according to actual conditions.

The large step size is assumed to be N=10 (the present application is not limited thereto and the value may be set according to actual needs). Starting from the delay value of "0" on the left side of the initial delay range, by increasing toward the right side of the initial delay range according to the large step size of 10, a plurality of delay values for CA0 under midVref may be obtained, for example, 0, 10, 20, 30, 40, 50, 60, 70, 80, 90, 100, 110, 120, . . . , 690, 700, 710, . . . 1010, 1020. First, starting from the delay value of 0, under midVref, a determination is made as to whether CA0 can operate normally (some preset data is written to the semiconductor memory). Then, after the delay value of 0, the some preset data already written is read from the semiconductor memory. If the read data is consistent with the some preset data already written, it is determined that CA0 can operate normally at the delay value of 0 under midVref. If not consistent, it is determined that CA0 cannot operate normally. The subsequent test is similar. If the result shows that CA0 cannot operate normally (i.e., shows abnormal operation), a determination is further made as to whether CA0 can operate normally at the delay value of 20. This process is repeated, until it is found that CA0 still cannot operate normally under midVref at the delay value of 100. However, it is found that CA0 can operate normally under midVref at the delay value of 110. That is, it is found for the first time that the results of CA0 at two adjacent delay values of 100 and 110 are not consistent. In this case, it may be determined that the left margin value of the operating delay range of CA0 under midVref is between 100 and 110. Then, the left margin value of the operating delay range of CA0 under midVref may be precisely searched between 100 and 110 according to the small step size M (it is assumed to be 2 and is not limited in the present application) that is less than the large step size N.

Then, starting from the delay value of 100 on the left side among the two adjacent delay values of 100 and 110 found for the first time, the delay values 102, 104, 106, 108 may be obtained for CA0 under midVref in an increasing order according to the small step size of 2. Here, since the left margin value of the actual operating delay range of CA0 under midVref is 104, the test result is indicative of abnormal operation at the delay value of 102. Then, a determination is further made as to whether CA0 can operate normally at the delay value of 104 under midVref. The test result here shows that it can operate normally. That is, it is found for the first time that the test results of CA0 at two adjacent delay values of 102 and 104 are inconsistent. In this case, the delay value of 104 on the right side may be used as a minimum delay value for CA0 under midVref, i.e., the left margin value obtained by the test.

Continuing from the delay value of 110, it may be found that CA0 can operate normally under midVref at the delay values of 120, 130, . . . , 700. However, CA0 cannot operate normally under midVref at the delay value of 710. That is, it is found for the second time that the test results of CA0 at two adjacent delay values of 700 and 710 are inconsistent. It is indicated that the right margin value of the operating delay range of CA0 under midVref is between 700 and 710. In this case, the right margin value is precisely searched between 700 and 710 according to the small step size.

If the minimum value among the minimum delay values for all target signal lines under midVref is greater than the minimum value among the minimum delay values for all target signal lines under midVref-1, it is indicated that the historical expected delay value is on the right of the 81 reference voltages sorted in an ascending order. Then, starting from midVref, the historical expected delay value may be searched towards the right side. Similarly, the historical expected delay value may be searched according to a large step size first to reduce the search range, and then precisely searched in the reduced search range according to a small step size.

For example, it is assumed that, starting from midVref=30, the reference voltages 38, 46, 54, 62, 70, 78, 86 are obtained in an increasing order according to the large step size (assumed to be 8). Six minimum delay values for CA0-CA5 under the reference voltage 38 are obtained, and then the minimum value among the six minimum delay values is used as the minimum delay value for CA0-CA5 under the reference voltage 38. Similarly, the minimum delay value for CA0-CA5 under the reference voltage 46 may be obtained. If the minimum delay value for CA0-CA5 under the reference voltage 38 is less than the minimum delay value for CA0-CA5 under the reference voltage 46, it is indicated that the historical expected delay value is on the right of the reference voltage 46. It is needed to search the historical expected delay value continuously. This process is repeated. The minimum delay value for CA0-CA5 under the reference voltage 62 is obtained. By comparison, it is found that the minimum delay value for CA0-CA5 under the reference voltage 54 is greater than the minimum delay value for CA0-CA5 under the reference voltage 62, indicating that the historical expected delay value is between the two adjacent reference voltages 54 and 62. Then, the historical expected delay value is searched between the reference voltage 54 and the reference voltage 62 according to the small step size.

For example, starting from the reference voltage 54, the reference voltages 54, 56, 58, 60, 62 may be obtained in an increasing order according to the small step size of 2. Six minimum delay values for CA0-CA5 under the reference voltage 56 are obtained, and then the minimum value among the six minimum delay values is used as the minimum delay value for CA0-CA5 under the reference voltage 56. By comparison, it is found that the minimum delay value for CA0-CA5 under the reference voltage 56 is greater than the reference delay value for CA0-CA5 under the reference voltage 58, so the minimum delay value for CA0-CA5 under the reference voltage 56 may be used as the historical expected delay value.

Figure 5:
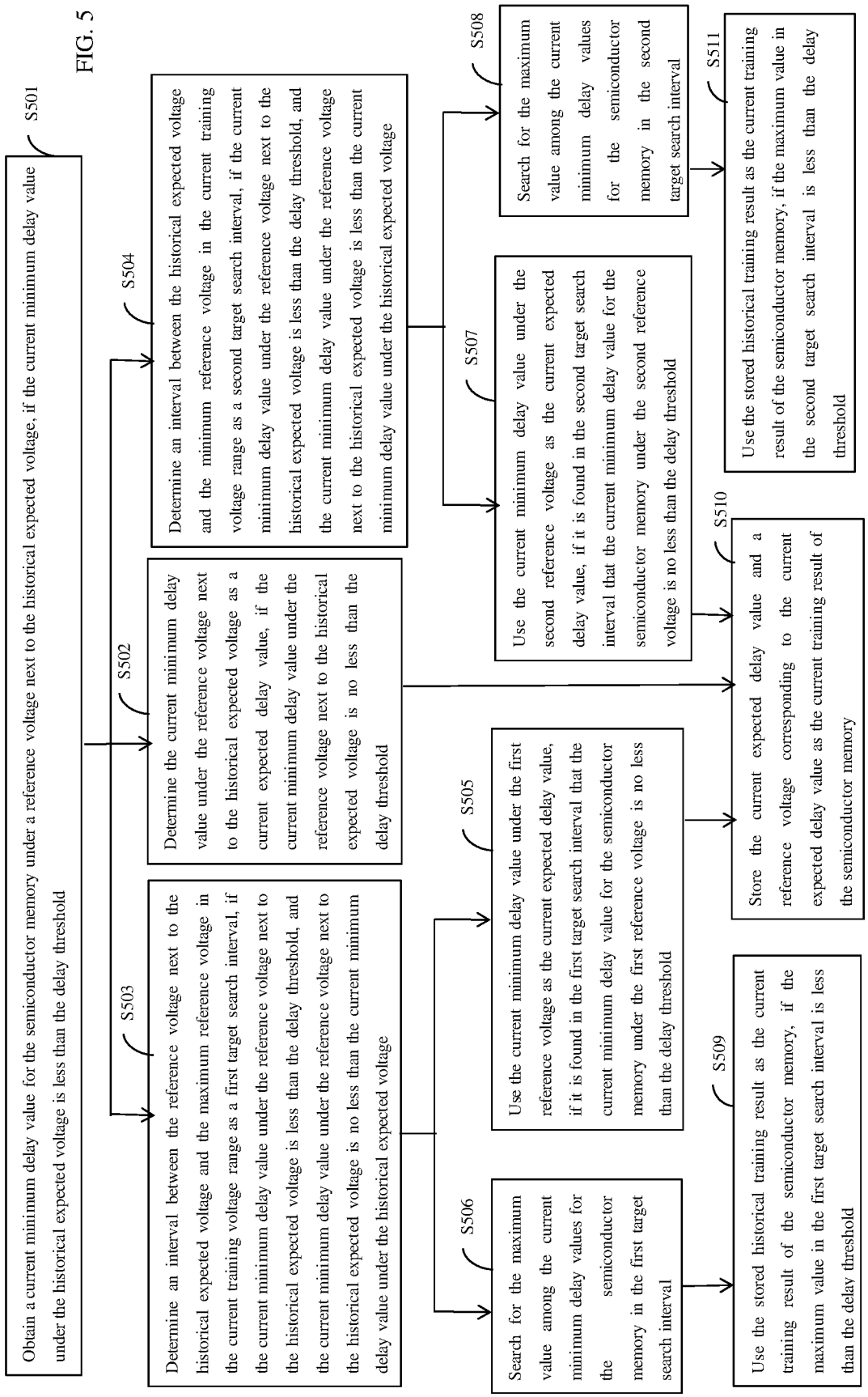
FIG. 5 schematically shows a flowchart of a semiconductor memory training method according to an embodiment of the present application.

FIG. 5 schematically shows a flowchart of a semiconductor memory training method according to an embodiment of the present application. As shown in FIG. 5, compared with the foregoing embodiment, the difference lies in that the following steps may be further included.

In the step S501, a current minimum delay value for the semiconductor memory under a reference voltage next to the historical expected voltage is obtained, if the current minimum delay value under the historical expected voltage is less than the delay threshold.

A delay threshold M less than or equal to the historical expected delay value minDelay and a current training voltage range for the current training are set. the historical training result is read from the non-volatile memory. During the current training, the historical expected voltage tVref for the historical training is used as the initial reference voltage for the current training.

In an embodiment of the present application, a variable (symbol) flag may be used to identify whether the current expected delay value is on the left or right of the stored historical expected delay value. In the embodiment of FIG. 5, flag=0 is on the right by default.

During the current training, if the current minimum delay value tDelay under tVref is no less than the delay threshold M, the current training is ended. the historical training result stored in the non-volatile memory remains unchanged.

In an embodiment of the present application, during the current training, the current minimum delay value for each target signal line under tVref is obtained first, and then the minimum value among all the current minimum delay values for all target signal lines under tVref is used as the current minimum delay value tDelay under tVref. For example, six minimum delay values (the left margin value) for CA0, CA1, . . . CA5 under tVref are obtained respectively, and then the minimum value among the six minimum delay values is used as tDelay.

In the current training, if the current minimum delay value tDelay under tVref is less than the delay threshold M, the current minimum delay value cDelay under tVref+1 may be continuously obtained, and the process proceeds to the following steps S502, S503 or S504.

In the step S502, the current minimum delay value under the reference voltage next to the historical expected voltage is determined as a current expected delay value, if the current minimum delay value under the reference voltage next to the historical expected voltage is no less than the delay threshold.

If cDelay>=M, similarly, it is indicated that the influence of the current operating temperature or operating voltage on the offset of the relationship curve may be ignored. In this case, the current training may be ended, and the process proceeds to the step S510.

Further referring to FIG. 5, in the step S503, an interval between the reference voltage next to the historical expected voltage and the maximum reference voltage in the current training voltage range is determined as a first target search interval, if the current minimum delay value under the reference voltage next to the historical expected voltage is less than the delay threshold, and the current minimum delay value under the reference voltage next to the historical expected voltage is no less than the current minimum delay value under the historical expected voltage.

If cDelay<M and cDelay>=tDelay, it is indicated that the current expected delay value is on the right side, then the interval between the tVref+1 and the maximum reference voltage in the current training voltage range is used as the first target search interval. The current expected delay value may be searched in the first target search interval towards the right side, and the process proceeds to the step S505 or S506.

In the step S504, an interval between the historical expected voltage and the minimum reference voltage in the current training voltage range is determined as a second target search interval, if the current minimum delay value under the reference voltage next to the historical expected voltage is less than the delay threshold, and the current minimum delay value under the reference voltage next to the historical expected voltage is less than the current minimum delay value under the historical expected voltage.

If cDelay<M and cDelay<tDelay, it is indicated that the current expected delay value is on the left side, then the interval between the tVref+1 and the minimum reference voltage in the current training voltage range is used as the second target search interval. The current expected delay value may be searched in the second target search interval towards the left side, and the step S507 or S508 is carried out.

In the step S505, the current minimum delay value under the first reference voltage is used as the current expected delay value, if it is found in the first target search interval that the current minimum delay value for the semiconductor memory under the first reference voltage is no less than the delay threshold.

Following the step S503, the current minimum delay value cDelay under tVref+1 is assigned to tDelay (that is, update tDelay with cDelay); the current minimum delay value cDelay under tVref+2 is obtained; the current minimum delay value cDelay under tVref+2 is compared with M and the updated tDelay (that is, the current minimum delay value under tVref+1); and the reference voltages are increased successively. This step is repeated. If it is found in the first target search interval that the current minimum delay value cDelay under a certain reference voltage (called the first reference voltage) is no less than the delay threshold M, the current training may be ended and the process proceeds to the step S510.

In the step S506, the maximum value among the current minimum delay values for the semiconductor memory is searched in the first target search interval.

Following the step S503, the process proceeds to the step S506 if it is not found in the first target search interval that the current minimum delay value cDelay under a certain reference voltage is no less than the delay threshold M. That is, the maximum value (also referred to as the maximum value on the right side) among the current minimum delay values for the semiconductor memory is searched in the first target search interval, and the process proceeds to the step S509.

In the step S507, the current minimum delay value under the second reference voltage is used as the current expected delay value, if it is found in the second target search interval that the current minimum delay value for the semiconductor memory under the second reference voltage is no less than the delay threshold.

Following the step S504, the current minimum delay value cDelay under tVref-1 is obtained; the current minimum delay value cDelay under tVref-1 is compared with M and tDelay (that is, the current minimum delay value under tVref); and the reference voltages are increased successively. This step is repeated. If it is found in the second target search interval that the current minimum delay value cDelay under a certain reference voltage (called the second reference voltage) is no less than the delay threshold M, the current training may be ended and the process proceeds to the step S510.

In the step S508, the maximum value among the current minimum delay values for the semiconductor memory is searched in the second target search interval.

Following the step S504, the process proceeds to the step S508 if it is not found in the second target search interval that the current minimum delay value cDelay under a certain reference voltage is no less than the delay threshold M. That is, the maximum value (also referred to as the maximum value on the left side) among the current minimum delay values for the semiconductor memory is searched in the second target search interval, and the process proceeds to the step S511.

In the step S509, the stored historical training result is used as the current training result of the semiconductor memory, if the maximum value in the first target search interval is less than the delay threshold.

Following the step S506, if the maximum value on the right side is still less than M, it is indicated that the current training is failed. So, the current training is ended, and the historical training result in the non-volatile memory remains unchanged.

In the step S510, the current expected delay value and a reference voltage corresponding to the current expected delay value are stored as the current training result of the semiconductor memory.

If the process proceeds to the step S510 from the step S502, tVref+1 used as the current training tVref (the current expected voltage, which may be used as the historical expected voltage for the next training), and its corresponding cDelay updated to minDelay (the current expected delay value, which may be used as the historical expected delay value for the next training) are stored in the non-volatile memory to replace the historical training result of the historical training (the previous training). In this case, only two trainings are needed to determine the current training result.

If the process proceeds to the step S510 from the step S505, the first reference voltage is used as the current expected voltage for the current training, and the current minimum delay value under the first reference voltage is used as the current expected delay value, and tVref and minDelay in the non-volatile memory are updated with the current expected voltage and the current expected delay value.

If the process proceeds to the step S510 from the step S507, the second reference voltage is used as the current expected voltage for the current training, and the current minimum delay value under the second reference voltage is used as the current expected delay value, and tVref and minDelay in the non-volatile memory are updated with the current expected voltage and the current expected delay value.

In the step S511, the stored historical training result is used as the current training result of the semiconductor memory, if the maximum value in the second target search interval is less than the delay threshold.

Following the step S508, if the maximum value on the left side is still less than M, it is indicated that the current training is failed. So, the current training is ended, and the historical training result in the non-volatile memory remains unchanged.

It may be understood that, by the method in the embodiments of the present application, the stored historical training result may be updated over time. For example, the previously stored historical training result may be replaced with the current training result. In this case, the current training result becomes the updated historical training result, and the updated historical training result is used as the historical training result for the next training.

Figure 6:
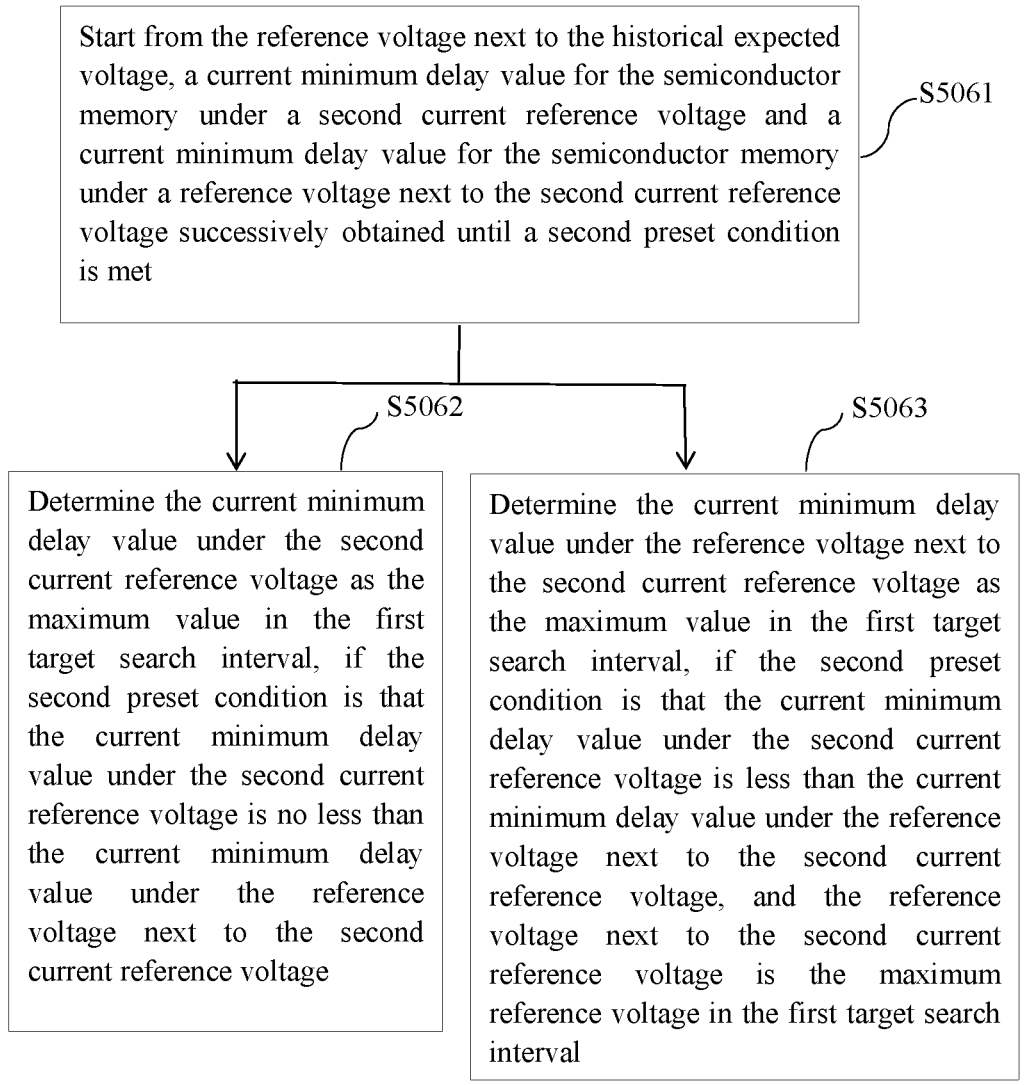
FIG. 6 schematically shows a processing flowchart of the step S506 of FIG. 5 in an exemplary embodiment.

FIG. 6 schematically shows a processing flowchart of the step S506 of FIG. 5 in an exemplary embodiment. As shown in FIG. 6, in an embodiment of the present application, the step S506 may further comprise the following steps.

In the step S5061, starting from the reference voltage next to the historical expected voltage, a current minimum delay value for the semiconductor memory under a second current reference voltage and a current minimum delay value for the semiconductor memory under a reference voltage next to the second current reference voltage are successively obtained until a second preset condition is met.

In order to find the maximum value among the current minimum delay values for the semiconductor memory in the first target search interval (that is, the maximum value on the right side), starting from tVref+1, first, by using tVref+1 as the second current reference voltage, the current minimum delay value under tVref+1 is obtained, and then the current minimum delay value under tVref+2 is obtained. If the current minimum delay value under tVref+1 is less than the current minimum delay value under tVref+2, it is indicated that the maximum value on the right side needs to be searched toward the right side. In this case, by using tVref+2 as the second current reference voltage, the current minimum delay value under tVref+3 is obtained, and the current minimum delay value under tVref+2 is compared with the current minimum delay value under tVref+3. This process is repeated.

In the step S5062, the current minimum delay value under the second current reference voltage is determined as the maximum value in the first target search interval, if the second preset condition is that the current minimum delay value under the second current reference voltage is no less than the current minimum delay value under the reference voltage next to the second current reference voltage.

This step is repeated. If it is found in the first target search interval that the current minimum delay value under a certain second current reference voltage is no less than the current minimum delay value under a reference voltage next to the second current reference voltage, the current minimum delay value under the second current reference voltage may be used as the maximum value on the right side. This case corresponds to the normal distribution of delays and voltages shown in FIG. 3.

In the step S5063, the current minimum delay value under the reference voltage next to the second current reference voltage is determined as the maximum value in the first target search interval, if the second preset condition is that the current minimum delay value under the second current reference voltage is less than the current minimum delay value under the reference voltage next to the second current reference voltage, and the reference voltage next to the second current reference voltage is the maximum reference voltage in the first target search interval.

On the contrary, if it is not found in the first target search interval that the current minimum delay value under a certain second current reference voltage is no less than the current minimum delay value under a reference voltage next to the second current reference voltage, and the current minimum delay value under the maximum reference voltage in the first target search interval is greater than the current minimum delay value under a reference voltage prior to the maximum reference voltage, this case corresponds to the case shown in FIG. 4 where the delay increases with the increase of the voltage. In this case, the current minimum delay value under the maximum reference voltage in the first target search interval is used as the maximum value on the right side.

In a manner similar to FIG. 6, the maximum value among the current minimum delay values for the semiconductor memory, that is, the maximum value on the left side, may be searched in the second target search interval.

In the embodiments of FIGS. 5 and 6, when the current test is started, the current expected delay value is on the right of the historical expected delay value by default. However, the present application is not limited thereto, and flag=1 may be set. That is, the current expected delay value is on the left of the historical expected delay value by default.

In an exemplary embodiment, the method may further comprise: obtaining a current minimum delay value for the semiconductor memory under a reference voltage prior to the historical expected voltage, if the current minimum delay value under the historical expected voltage is less than the delay threshold; and determining the current minimum delay value under the reference voltage prior to the historical expected voltage as a current expected delay value, if the current minimum delay value under the reference voltage prior to the historical expected voltage is no less than the delay threshold.

In an exemplary embodiment, the method may further comprise: determining an interval between the reference voltage prior to the historical expected voltage and the minimum reference voltage in the current training voltage range as a third target search interval, if the current minimum delay value under the reference voltage prior to the historical expected voltage is less than the delay threshold and the current minimum delay value under the reference voltage prior to the historical expected voltage is no less than the current minimum delay value under the historical expected voltage; using a current minimum delay value under a third reference voltage as the current expected delay value, if it is found in the third target search interval that the current minimum delay value for the semiconductor memory under the third reference voltage is no less than the delay threshold; and storing the current expected delay value and a reference voltage corresponding to the current expected delay value as the current training result of the semiconductor memory.

In an exemplary embodiment, the method may further comprise: searching for, in the third target search interval, the maximum value among the current minimum delay values for the semiconductor memory; and using the stored historical training result as the current training result of the semiconductor memory, if the maximum value in the third target search interval is less than the delay threshold.

In an exemplary embodiment, searching for, in the third target search interval, the maximum value among the current minimum delay values for the semiconductor memory may comprise: starting from the reference voltage prior to the historical expected voltage, successively obtaining a current minimum delay value for the semiconductor memory under a third current reference voltage and a current minimum delay value for the semiconductor memory under a reference voltage prior to the third current reference voltage until a third preset condition is met; and determining the current minimum delay value under the third current reference voltage as the maximum value in the third target search interval, if the third preset condition is that the current minimum delay value under the third current reference voltage is no less than the current minimum delay value under the reference voltage prior to the third current reference voltage.

In an exemplary embodiment, searching for, in the third target search interval, the maximum value among the current minimum delay values for the semiconductor memory may further comprise: determining the current minimum delay value under the minimum reference voltage in the third target search interval as the maximum value in the third target search interval, if the third preset condition is that the current minimum delay value under the third current reference voltage is less than the current minimum delay value under the reference voltage prior to the third current reference voltage, and the reference voltage prior to the third current reference voltage is the minimum reference voltage in the third target search interval.

In an exemplary embodiment, the method may further comprise: determining an interval between the historical expected voltage and the maximum reference voltage in the current training voltage range as a fourth target search interval, if the current minimum delay value under the reference voltage prior to the historical expected voltage is less than the delay threshold and the current minimum delay value under the reference voltage prior to the historical expected voltage is less than the current minimum delay value under the historical expected voltage; and using a current minimum delay value under a fourth reference voltage as the current expected delay value, if it is found in the fourth target search interval that the current minimum delay value for the semiconductor memory under the fourth reference voltage is no less than the delay threshold.

In an exemplary embodiment, the method may further comprise: searching for, in the fourth target search interval, the maximum value among the current minimum delay values for the semiconductor memory; and using the stored historical training result as the current training result of the semiconductor memory, if the maximum value in the fourth target search interval is less than the delay threshold.

For example, during the current training, if the current minimum delay value tDelay under tVref is no less than the delay threshold M, the current training is ended. the historical training result stored in the non-volatile memory remains unchanged.

In the current training, if the current minimum delay value tDelay under tVref is less than the delay threshold M, the current minimum delay value cDelay under tVref-1 is obtained. If the current minimum delay value cDelay under tVref-1 is no less than the current minimum delay value tDelay under tVref, it is indicated that the current expected delay value is on the left of tVref-1. In this case, the current expected delay value is searched on the left of tVref-1. If it is found in the third target search interval for the first time that the current minimum delay value under a certain third reference voltage is no less than the delay threshold M, the current training is ended. The third reference voltage is used as the current expected voltage, and the current minimum delay value under the third reference voltage is used as the current expected delay value to update the historical training result stored in the non-volatile memory. If the maximum value on the left side is found in the third target search interval and the maximum value on the left side in the third target search interval is still less than the delay threshold M, it is indicated that the current training is failed. The current training is ended, and the historical training result stored in non-volatile memory remains unchanged.

If the current minimum delay value cDelay under tVref-1 is less than the current minimum delay value tDelay under tVref, it is indicated that the current expected delay value is on the right of tVref. The current expected delay value is searched toward the right side from tVref+1. If it is found in the fourth target search interval for the first time that the current minimum delay value under a certain fourth reference voltage is no less than the delay threshold M, the current training is ended. The fourth reference voltage is used as the current expected voltage, and the current minimum delay value under the fourth reference voltage is used as the current expected delay value to update the historical training result stored in the non-volatile memory. If the maximum value on the right side is found in the fourth target search interval and the maximum value on the right side in the fourth target search interval is still less than the delay threshold M, it is indicated that the current training is failed. The current training is ended, and the historical training result stored in non-volatile memory remains unchanged.

Hereinafter, the method described in the above embodiments will be exemplified with reference to FIGS. 7 and 8.

Figure 7:
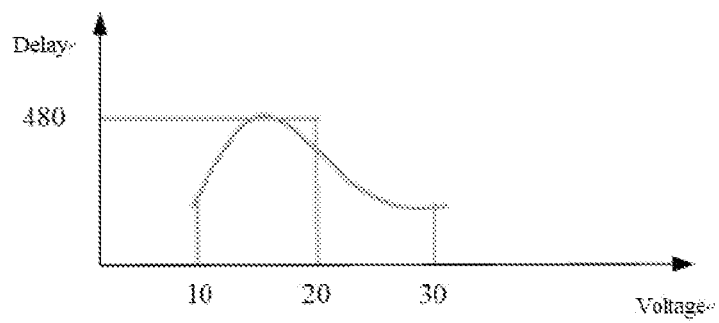
FIG. 7 schematically shows a schematic view of the semiconductor memory training method according to an embodiment of the present application.

FIG. 7 schematically shows a schematic view of the semiconductor memory training method according to an embodiment of the present application.

As shown in FIG. 7, it is assumed that the historical training result stored in the non-volatile memory comprises a historical expected voltage of 20 and a historical expected delay value of 530. And, the delay threshold is 480 and the current training voltage range is 10-30.

It is assumed that the actual delay distribution of the semiconductor memory under the current operating temperature or operating voltage is shown in Table 1 below.

TABLE 1

| Delay | — | — | — | — | 463 | 476 | 490 | 478 | 470 | 461 | 452 |
|---|---|---|---|---|---|---|---|---|---|---|---|
| Reference voltage | 10 | 11 | 12 | 13 | 14 | 15 | 16 | 17 | 18 | 19 | 20 |
| Delay | 440 | — | — | — | — | — | — | — | — | — | — |
| Reference voltage | 21 | 22 | 23 | 24 | 25 | 26 | 27 | 28 | 29 | 30 | |

In the current test, first, the current minimum delay value of 452 under the reference voltage 20 is obtained, which is less than the delay threshold of 480. Then, the current minimum delay value of 440 under the reference voltage 21 is obtained, which is still less than the delay threshold of 480, and the current minimum delay value of 440 under the reference voltage 21 is less than the current minimum delay value of 452 under the reference voltage 20. It is indicated that the current expected delay value is on the left of the reference voltage 20.

Then, the current minimum delay value of 461 under a reference voltage 19 (20-1) prior to the reference voltage 20 is obtained, which is still less than the delay threshold of 480.

This step is repeated to obtain the current minimum delay value under a reference voltage 18 on the left side. This process goes on, and the current training is ended when it is found that the current minimum delay value under a reference voltage 26 is greater than the delay threshold of 480.

Figure 8:
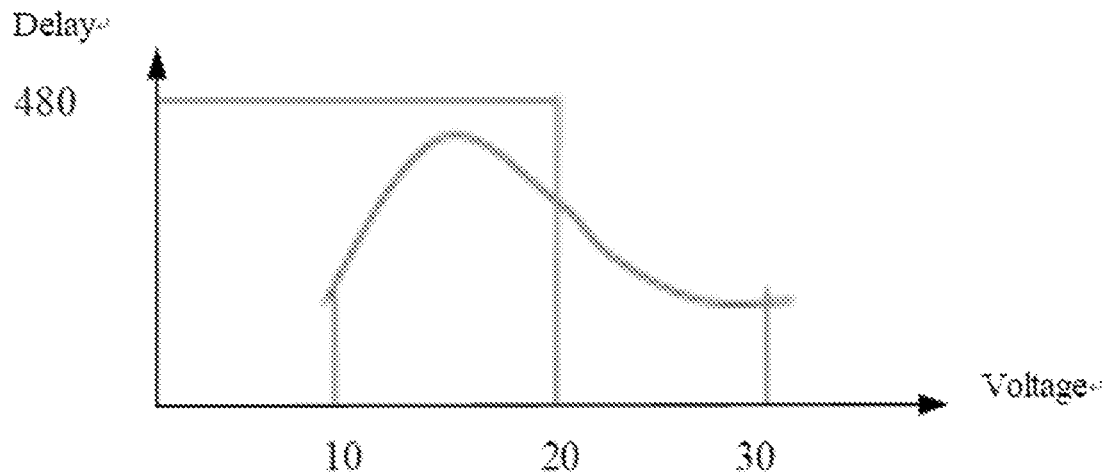
FIG. 8 schematically shows a schematic view of the semiconductor memory training method according to an embodiment of the present application.

FIG. 8 schematically shows a schematic view of the semiconductor memory training method according to an embodiment of the present application.

As shown in FIG. 8, it is assumed that the historical training result stored in the non-volatile memory comprises a historical expected voltage of 20 and a historical expected delay value of 530. And, the delay threshold is 480 and the current training voltage range is 10-30.

It is assumed that the actual delay distribution of the semiconductor memory under the current operating temperature or operating voltage is shown in Table 2 below.

TABLE 2

| Delay | — | — | — | — | 443 | 456 | 470 | 458 | 450 | 441 | 432 |
|---|---|---|---|---|---|---|---|---|---|---|---|
| Reference voltage | 10 | 11 | 12 | 13 | 14 | 15 | 16 | 17 | 18 | 19 | 20 |
| Delay | 420 | — | — | — | — | — | — | — | — | — | — |
| Reference voltage | 21 | 22 | 23 | 24 | 25 | 26 | 27 | 28 | 29 | 30 | |

In the current test, first, the current minimum delay value of 432 under the reference voltage 20 is obtained, which is less than the delay threshold of 480. Then, the current minimum delay value of 420 under a reference voltage 20+1 is obtained. Since 420<432, it is indicated that the current expected delay value is on the left of the reference voltage 20.

Then, the current minimum delay value of 441 under a reference voltage 19 (20−1) is obtained, which is less than the delay threshold of 480. The current expected delay value is searched toward the left side.

Then, the current minimum delay value of 450 under a reference voltage 18 is obtained, which is greater than the current minimum delay value of 441 under the reference voltage 19. The current expected delay value is searched toward the left side.

Then, the current minimum delay value of 458 under a reference voltage 17 is obtained, which is greater than the current minimum delay value of 450 under the reference voltage 18. The current expected delay value is searched toward the left side.

Then, the current minimum delay value of 470 under a reference voltage 16 is obtained, which is greater than the current minimum delay value of 458 under the reference voltage 17.

The current expected delay value is searched toward the left side.

Then, the current minimum delay value of 456 under a reference voltage 15 is obtained, which is less than the current minimum delay value of 470 under the reference voltage 16. It is indicated that 470 is the maximum value on the left side, and the maximum value on the left side is still less than the delay threshold of 480. It is indicated that it is unable to find the current training result in the current training voltage range. That is, the current training is failed.

The semiconductor memory retraining method in the implementations of the present application is a training method based on memory. For the historical training, for example the first training, ideal delays under all reference voltages may be obtained according to certain rules as the historical expected delay values in the historical training result. Then, the obtained historical training result is saved in the non-volatile memory. The subsequent trainings may be performed based on the historical training result stored in the non-volatile memory. Meanwhile, the current training voltage range for subsequent trainings may be set. If the historical training result stored in the non-volatile memory does not meet the related requirements, training may be performed within the set current training voltage range. If the requirements cannot be met when the set current training voltage range is exceeded, the current training is failed. Since the training result of the semiconductor memory is relatively stable, according to the method in the embodiments of the present application, substantially, only one training is required. Compared with the traditional training methods, the training speed is increased and the computing resources are saved.

Figure 9:
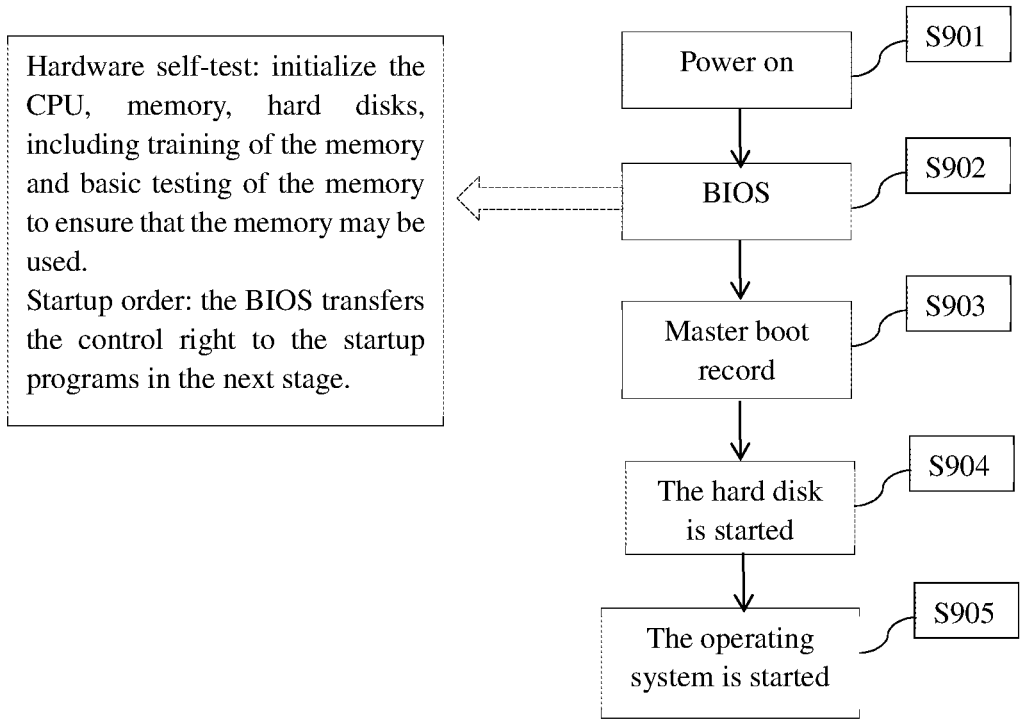
FIG. 9 schematically shows a flowchart of starting a computer according to an embodiment of the present application.

FIG. 9 schematically shows a flowchart of starting a computer according to an embodiment of the present application. In the embodiment of FIG. 9, taking the semiconductor memory as the memory in the computer as an example, the computer startup process will be described below.

In the step S901, the power switch of the computer is pressed down to power on the computer.

In the step S902, after the computer host is started, the BIOS (Basic Input Output System) begins to take over all self-test tasks initiated by the mainboard.

The system first checks the internal devices by the POST (Power On Self Test) program. The complete POST self-test comprises hardware self-test, such as initializing the CPU, memory, hard disks, etc., including training of the memory and basic testing of the memory to ensure that the memory may be used. Here, the memory may be trained by the method described in the above embodiments. Once a problem is found in the self-test process, the system will give a prompt message or buzzer alarm.

Figure 10:
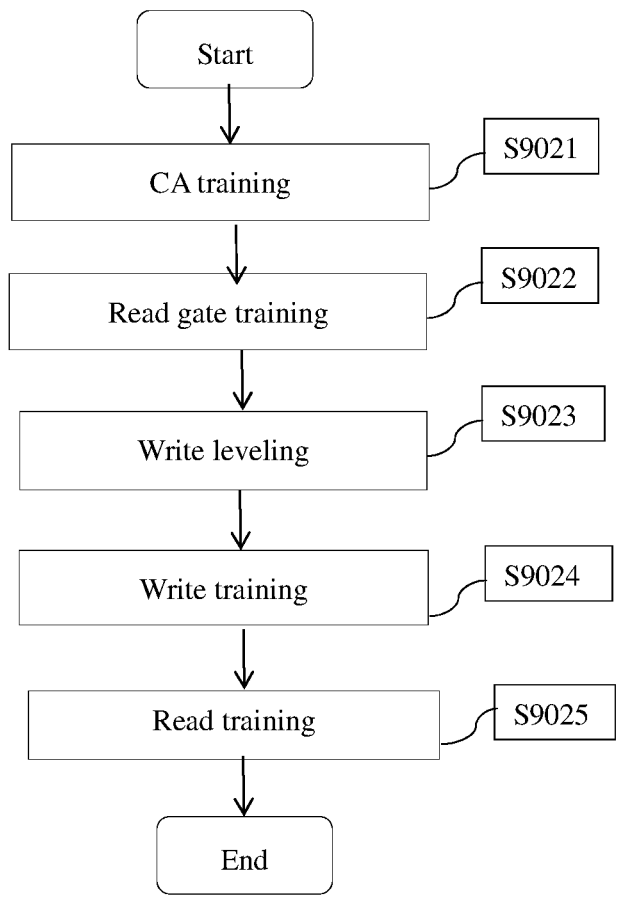
FIG. 10 schematically shows a processing flowchart of the step S902 of FIG. 9 in an exemplary embodiment.

As shown in FIG. 10, the memory can go through the following training processes:

in the step S9021, CA training;
in the step S9022, read gate training;
in the step S9023, write leveling;
in the step S9024, write training; and
in the step S9025, read training.

CA training and read/write training are both two-dimensional training (i.e., two dimensions of voltage and delay). Read gate training and write leveling are both one-dimensional training (only adjustment of the delay).

It should be noted that different memory controllers may add other trainings, which is not limited in the present application.

Then, the BIOS transfers the control right to the startup programs in the next stage, in accordance with the startup sequence.

In the step S903, the master boot record is started.
In the step S904, the hard disk is started.
In the step S905, the operating system is started.

The BIOS transfers the control of the system to the master boot record, and finally completes the transition to the operating state of the operating system.

The following describes the embodiments of the apparatus of the present application, which may be used to execute the above-mentioned data resource processing method of the present application. For details not disclosed in the embodiments of the apparatus of the present application, please refer to the embodiments of the data resource processing method of the present application.

Figure 11:
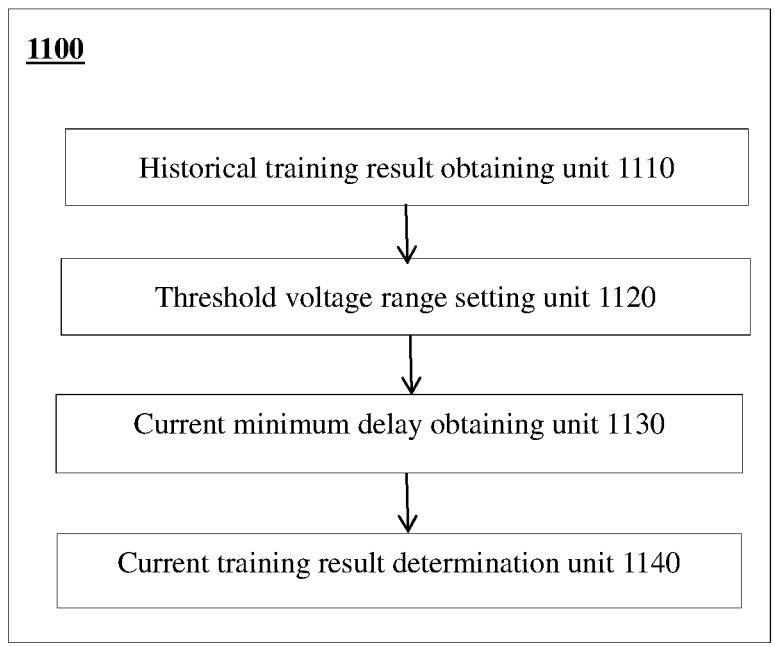
FIG. 11 schematically shows a block diagram of a semiconductor memory training apparatus according to an embodiment of the present application.

FIG. 11 schematically shows a block diagram of a semiconductor memory training apparatus according to an embodiment of the present application. As shown in FIG. 11, the semiconductor memory training apparatus 1100 according to an embodiment of the present application may comprise a historical training result obtaining unit 1110, a threshold voltage range setting unit 1120, a current minimum delay obtaining unit 1130 and a current training result determination unit 1140.

the historical training result obtaining unit 1110 may be configured to obtain the stored historical training result, the historical training result comprising a historical expected delay value and a historical expected voltage. The threshold voltage range setting unit 1120 may be configured to set a delay threshold and a current training voltage range, the delay threshold being less than or equal to the historical expected delay value, the current training voltage range comprising the historical expected voltage. The current minimum delay obtaining unit 1130 may be configured to obtain a current minimum delay value for the semiconductor memory under the historical expected voltage. The current training result determination unit 1140 may be configured to use the stored historical training result as a current training result of the semiconductor memory if the current minimum delay value under the historical expected voltage is no less than the delay threshold.

In an exemplary embodiment, the semiconductor memory has a plurality of reference voltages.

In an exemplary embodiment, the semiconductor memory training apparatus 1100 may further comprise: a historical minimum delay value obtaining unit which may be configured to: before obtaining the stored historical training result, starting from a minimum reference voltage among the plurality of reference voltages, successively obtain a historical minimum delay value for the semiconductor memory under a first current reference voltage and a historical minimum delay value for the semiconductor memory under a reference voltage next to the first current reference voltage until a first preset condition is met; a first historical expected delay value determination unit which may be configured to determine the historical minimum delay value under the first current reference voltage as the historical expected delay value, if the first preset condition is that the historical minimum delay value under the first current reference voltage is no less than the historical minimum delay value under the reference voltage next to the first current reference voltage; and a first historical training result storage unit which may be configured to store the historical expected delay value and the historical expected voltage as the historical training result of the semiconductor memory.

In an exemplary embodiment, the semiconductor memory training apparatus 1100 may further comprise: a second historical expected delay value determination unit which may be configured to: before obtaining the stored historical training result, determine the historical minimum delay value under the reference voltage next to the first current reference voltage as the historical expected delay value, if the first preset condition is that the historical minimum delay value under the first current reference voltage is less than the historical minimum delay value under the reference voltage next to the first current reference voltage, and the reference voltage next to the first current reference voltage is the maximum reference voltage among the plurality of reference voltages; and a second historical training result storage unit which may be configured to store the historical expected delay value and the historical expected voltage as the historical training result of the semiconductor memory.

In an exemplary embodiment, the semiconductor memory training apparatus 1100 may further comprise: a first current minimum delay value obtaining unit which may be configured to obtain a current minimum delay value for the semiconductor memory under a reference voltage next to the historical expected voltage, if the current minimum delay value under the historical expected voltage is less than the delay threshold; and a first current expected delay value determination unit which may be configured to determine the current minimum delay value under the reference voltage next to the historical expected voltage as a current expected delay value, if the current minimum delay value under the reference voltage next to the historical expected voltage is no less than the delay threshold.

In an exemplary embodiment, the semiconductor memory training apparatus 1100 may further comprise: a first target search interval determination unit which may be configured to determine an interval between the reference voltage next to the historical expected voltage and the maximum reference voltage in the current training voltage range as a first target search interval, if the current minimum delay value under the reference voltage next to the historical expected voltage is less than the delay threshold, and the current minimum delay value under the reference voltage next to the historical expected voltage is no less than the current minimum delay value under the historical expected voltage; a second current expected delay value determination unit which may be configured to use a current minimum delay value under a first reference voltage as the current expected delay value, if it is found in the first target search interval that the current minimum delay value for the semiconductor memory under the first reference voltage is no less than the delay threshold; and a first current training result storage unit which may be configured to store the current expected delay value and a reference voltage corresponding to the current expected delay value as the current training result of the semiconductor memory.

In an exemplary embodiment, the semiconductor memory training apparatus 1100 may further comprise: a unit for searching for the maximum value in the first target search interval, which may be configured to search for, in the first target search interval, the maximum value among the current minimum delay values for the semiconductor memory; and a first historical training result maintaining unit which may be configured to use the stored historical training result as the current training result of the semiconductor memory, if the maximum value in the first target search interval is less than the delay threshold.

In an exemplary embodiment, the unit for searching for the maximum value in the first target search interval may comprise: a second current minimum delay obtaining unit which may be configured to: starting from the reference voltage next to the historical expected voltage, successively obtain a current minimum delay value for the semiconductor memory under a second current reference voltage and a current minimum delay value for the semiconductor memory under a reference voltage next to the second current reference voltage until a second preset condition is met; and a unit for judging the maximum value in the first target search interval, which may be configured to determine the current minimum delay value under the second current reference voltage as the maximum value in the first target search interval, if the second preset condition is that the current minimum delay value under the second current reference voltage is no less than the current minimum delay value under the reference voltage next to the second current reference voltage.

In an exemplary embodiment, the unit for searching for the maximum value in the first target search interval may further comprise: a unit for determining the maximum value in the first target search interval, which may be configured to determine the current minimum delay value under the reference voltage next to the second current reference voltage as the maximum value in the first target search interval, if the second preset condition is that the current minimum delay value under the second current reference voltage is less than the current minimum delay value under the reference voltage next to the second current reference voltage, and the reference voltage next to the second current reference voltage is the maximum reference voltage in the first target search interval.

In an exemplary embodiment, the semiconductor memory training apparatus 1100 may further comprise: a second target search interval determination unit which may be configured to determine an interval between the historical expected voltage and the minimum reference voltage in the current training voltage range as a second target search interval, if the current minimum delay value under the reference voltage next to the historical expected voltage is less than the delay threshold, and the current minimum delay value under the reference voltage next to the historical expected voltage is less than the current minimum delay value under the historical expected voltage; a third current expected delay value determination unit which may be configured to use a current minimum delay value under a second reference voltage as the current expected delay value, if it is found in the second target search interval that the current minimum delay value for the semiconductor memory under the second reference voltage is no less than the delay threshold; and a second current training result storage unit which may be configured to store the current expected delay value and a reference voltage corresponding to the current expected delay value as the current training result of the semiconductor memory.

In an exemplary embodiment, the semiconductor memory training apparatus 1100 may further comprise: a unit for searching for the maximum value in the second target search interval, which may be configured to search for, in the second target search interval, the maximum value among the current minimum delay values for the semiconductor memory; and a second historical training result maintaining unit which may be configured to use the stored historical training result as the current training result of the semiconductor memory, if the maximum value in the second target search interval is less than the delay threshold.

In an exemplary embodiment, the semiconductor memory training apparatus 1100 may further comprise: a third current minimum delay value obtaining unit which may be configured to obtain a current minimum delay value for the semiconductor memory under a reference voltage prior to the historical expected voltage, if the current minimum delay value under the historical expected voltage is less than the delay threshold; and a fourth current expected delay value determination unit which may be configured to determine the current minimum delay value under the reference voltage prior to the historical expected voltage as a current expected delay value, if the current minimum delay value under the reference voltage prior to the historical expected voltage is no less than the delay threshold.

In an exemplary embodiment, the semiconductor memory training apparatus 1100 may further comprise: a third target search interval determination unit which may be configured to an interval between the reference voltage prior to the historical expected voltage and the minimum reference voltage in the current training voltage range as a third target search interval, if the current minimum delay value under the reference voltage prior to the historical expected voltage is less than the delay threshold and the current minimum delay value under the reference voltage prior to the historical expected voltage is no less than the current minimum delay value under the historical expected voltage; a fifth current expected delay value determination unit which may be configured to use a current minimum delay value under a third reference voltage as the current expected delay value, if it is found in the third target search interval that the current minimum delay value for the semiconductor memory under the third reference voltage is no less than the delay threshold; and a third current training result storage unit which may be configured to store the current expected delay value and a reference voltage corresponding to the current expected delay value as the current training result of the semiconductor memory.

In an exemplary embodiment, the semiconductor memory training apparatus 1100 may further comprise: a unit for searching for the maximum value in the third target search interval, which may be configured to search for, in the third target search interval, the maximum value among the current minimum delay values for the semiconductor memory; and a third historical training result maintaining unit which may be configured to use the stored historical training result as the current training result of the semiconductor memory, if the maximum value in the third target search interval is less than the delay threshold.

In an exemplary embodiment, the unit for searching for the maximum value in the third target search interval may comprise: a fourth current minimum delay value obtaining unit which may be configured to: starting from the reference voltage prior to the historical expected voltage, successively obtain a current minimum delay value for the semiconductor memory under a third current reference voltage and a current minimum delay value for the semiconductor memory under a reference voltage prior to the third current reference voltage until a third preset condition is met; and a unit for judging the maximum value in the third target search interval, which may be configured to determine the current minimum delay value under the third current reference voltage as the maximum value in the third target search interval, if the third preset condition is that the current minimum delay value under the third current reference voltage is no less than the current minimum delay value under the reference voltage prior to the third current reference voltage.

In an exemplary embodiment, the unit for searching for the maximum value in the third target search interval may further comprise: a unit for determining the maximum value in the third target search interval, which may be configured to determine the current minimum delay value under the minimum reference voltage in the third target search interval as the maximum value in the third target search interval, if the third preset condition is that the current minimum delay value under the third current reference voltage is less than the current minimum delay value under the reference voltage prior to the third current reference voltage, and the reference voltage prior to the third current reference voltage is the minimum reference voltage in the third target search interval.

In an exemplary embodiment, the semiconductor memory training apparatus 1100 may further comprise: a fourth target search interval determination unit which may be configured to determine an interval between the historical expected voltage and the maximum reference voltage in the current training voltage range as a fourth target search interval, if the current minimum delay value under the reference voltage prior to the historical expected voltage is less than the delay threshold and the current minimum delay value under the reference voltage prior to the historical expected voltage is less than the current minimum delay value under the historical expected voltage; and a sixth current expected delay value determination unit which may be configured to use a current minimum delay value under a fourth reference voltage as the current expected delay value, if it is found in the fourth target search interval that the current minimum delay value for the semiconductor memory under the fourth reference voltage is no less than the delay threshold.

In an exemplary embodiment, the semiconductor memory training apparatus 1100 may further comprise: a unit for searching for the maximum value in the fourth target search interval, which may be configured to search for, in the fourth target search interval, the maximum value among the current minimum delay values for the semiconductor memory; and a fourth historical training result maintaining unit which may be configured to use the stored historical training result as the current training result of the semiconductor memory, if the maximum value in the fourth target search interval is less than the delay threshold.

It should be noted that, although several units of the device for action execution are mentioned in the above detailed description, this division is not mandatory. In fact, according to the implementations of the present application, the features and functions of two or more units described above may be embodied in one unit. Conversely, the features and functions of a unit described above may be further divided into multiple units.

Through the above description of the implementations, those skilled in the art can easily understand that the exemplary implementations described here may be implemented by software, or may be implemented by the combination of software with necessary hardware. Therefore, the technical solutions according to the implementations of the present application may be embodied in the form of software products which may be stored in a non-volatile storage medium (which may be a CD-ROM, a U disk, a mobile hard disk, etc.) or on the network, including several instructions to enable a computing device (which may be a personal computer, a server, a touch terminal, or a network device, etc.) to execute the method according to the implementations of the present application.

Further, an implementation of the present application further provides an electronic device. The electronic device comprises: one or more processors; and a storage apparatus, configured to store one or more programs; and when the one or more programs are executed by the one or more processors, the one or more processors implement the method described in any of the above embodiments.

Further, an implementation of the present application further provides a computer-readable storage medium having computer programs stored thereon that, when the computer programs are executed by processors, the processors implement the method described in any of the above embodiments.

Those skilled in the art will readily think of other embodiments of the present application by considering the specification and practicing the present application disclosed herein. The present application is intended to encompass any variations, uses, or adaptive changes of the present application. These variations, uses, or adaptive changes follow the general principles of the present application and include common knowledge or conventional technical means in the technical field that are not disclosed in the present application. The specification and the embodiments are just exemplary, and the true scope and spirit of the present application are defined by the appended claims.

The invention claimed is:

1. A semiconductor memory training method, applied in an electronic device and being implemented by one or more processors in the electronic device, wherein a semiconductor memory has a plurality of reference voltages, and the semiconductor memory training method comprises:
   starting from a minimum reference voltage among the plurality of reference voltages, successively obtaining a historical minimum delay value for the semiconductor memory under a first current reference voltage and a historical minimum delay value for the semiconductor memory under a reference voltage next to the first current reference voltage until a first preset condition is met;
   determining the historical minimum delay value under the first current reference voltage as a historical expected delay value in response to the first preset condition being that the historical minimum delay value under the first current reference voltage is no less than the historical minimum delay value under the reference voltage next to the first current reference voltage;
   storing the historical expected delay value and a historical expected voltage as a stored historical training result of the semiconductor memory; and
   upon detecting at least one of a change in an operating temperature of the semiconductor memory or an operating voltage of the semiconductor memory:
      obtaining the stored historical training result of the semiconductor memory, the stored historical training result comprising the historical expected delay value and the historical expected voltage;
      setting a delay threshold and a current training voltage range, the delay threshold being less than or equal to the historical expected delay value, the current training voltage range comprising the historical expected voltage;
      obtaining a current minimum delay value for the semiconductor memory under the historical expected voltage; and
      training the semiconductor memory using the stored historical training result as a current training result of the semiconductor memory in response to the current minimum delay value for the semiconductor memory under the historical expected voltage being no less than the delay threshold.

2. The semiconductor memory training method according to claim 1, wherein, before obtaining the stored historical training result, the semiconductor memory training method further comprises:
   determining the historical minimum delay value under the reference voltage next to the first current reference voltage as the historical expected delay value in response to the first preset condition being that the historical minimum delay value under the first current reference voltage is less than the historical minimum delay value under the reference voltage next to the first current reference voltage and the reference voltage next to the first current reference voltage is a maximum reference voltage among the plurality of reference voltages; and
   storing the historical expected delay value and the historical expected voltage as the stored historical training result of the semiconductor memory.

3. The semiconductor memory training method according to claim 1, further comprising:
   obtaining a current minimum delay value for the semiconductor memory under a reference voltage next to the historical expected voltage in response to the current minimum delay value under the historical expected voltage being less than the delay threshold; and
   determining the current minimum delay value under the reference voltage next to the historical expected voltage as a current expected delay value in response to the current minimum delay value under the reference voltage next to the historical expected voltage being no less than the delay threshold.

4. The semiconductor memory training method according to claim 3, further comprising:
   determining an interval between the reference voltage next to the historical expected voltage and a maximum reference voltage in the current training voltage range as a first target search interval in response to the current minimum delay value under the reference voltage next to the historical expected voltage being less than the delay threshold and the current minimum delay value under the reference voltage next to the historical expected voltage being no less than the current minimum delay value under the historical expected voltage;
   using a current minimum delay value under a first reference voltage as the current expected delay value in response to finding in the first target search interval that the current minimum delay value for the semiconductor memory under the first reference voltage is no less than the delay threshold; and
   storing the current expected delay value and a reference voltage corresponding to the current expected delay value as the current training result of the semiconductor memory.

5. The semiconductor memory training method according to claim 4, further comprising:
   searching for, in the first target search interval, a maximum value among current minimum delay values for the semiconductor memory; and
   using the stored historical training result as the current training result of the semiconductor memory in response to the maximum value in the first target search interval being less than the delay threshold.

6. The semiconductor memory training method according to claim 5, wherein searching for, in the first target search interval, the maximum value among the current minimum delay values for the semiconductor memory comprises:
   starting from the reference voltage next to the historical expected voltage, successively obtaining a current minimum delay value for the semiconductor memory under a second current reference voltage and a current minimum delay value for the semiconductor memory under a reference voltage next to the second current reference voltage until a second preset condition is met; and determining the current minimum delay value under the second current reference voltage as the maximum value in the first target search interval in response to the second preset condition being that the current minimum delay value under the second current reference voltage is no less than the current minimum delay value under the reference voltage next to the second current reference voltage.

7. The semiconductor memory training method according to claim 6, wherein searching for, in the first target search interval, the maximum value among the current minimum delay values for the semiconductor memory further comprises:

determining the current minimum delay value under the reference voltage next to the second current reference voltage as the maximum value in the first target search interval in response to the second preset condition being that the current minimum delay value under the second current reference voltage is less than the current minimum delay value under the reference voltage next to the second current reference voltage and the reference voltage next to the second current reference voltage is a maximum reference voltage in the first target search interval.

8. The semiconductor memory training method according to claim 3, further comprising:

determining an interval between the historical expected voltage and a minimum reference voltage in the current training voltage range as a second target search interval in response to the current minimum delay value under the reference voltage next to the historical expected voltage being less than the delay threshold and the current minimum delay value under the reference voltage next to the historical expected voltage being less than the current minimum delay value under the historical expected voltage;

using a current minimum delay value under a second reference voltage as the current expected delay value in response to finding in the second target search interval that the current minimum delay value for the semiconductor memory under the second reference voltage is no less than the delay threshold; and storing the current expected delay value and a reference voltage corresponding to the current expected delay value as the current training result of the semiconductor memory.

9. The semiconductor memory training method according to claim 8, further comprising:

searching for, in the second target search interval, a maximum value among current minimum delay values for the semiconductor memory; and using the stored historical training result as the current training result of the semiconductor memory in response to the maximum value in the second target search interval being less than the delay threshold.

10. The semiconductor memory training method according to claim 1, further comprising:

obtaining a current minimum delay value for the semiconductor memory under a reference voltage prior to the historical expected voltage in response to the current minimum delay value under the historical expected voltage being less than the delay threshold; and determining the current minimum delay value under the reference voltage prior to the historical expected voltage as a current expected delay value in response to the current minimum delay value under the reference voltage prior to the historical expected voltage being no less than the delay threshold.

11. The semiconductor memory training method according to claim 10, further comprising:

determining an interval between the reference voltage prior to the historical expected voltage and a minimum reference voltage in the current training voltage range as a third target search interval in response to the current minimum delay value under the reference voltage prior to the historical expected voltage being less than the delay threshold and the current minimum delay value under the reference voltage prior to the historical expected voltage being no less than the current minimum delay value under the historical expected voltage;

using a current minimum delay value under a third reference voltage as the current expected delay value in response to finding in the third target search interval that the current minimum delay value for the semiconductor memory under the third reference voltage is no less than the delay threshold; and storing the current expected delay value and a reference voltage corresponding to the current expected delay value as the current training result of the semiconductor memory.

12. The semiconductor memory training method according to claim 11, further comprising:

searching for, in the third target search interval, a maximum value among current minimum delay values for the semiconductor memory; and using the stored historical training result as the current training result of the semiconductor memory in response to the maximum value in the third target search interval being less than the delay threshold.

13. The semiconductor memory training method according to claim 12, wherein searching for, in the third target search interval, the maximum value among the current minimum delay values for the semiconductor memory comprises:

starting from the reference voltage prior to the historical expected voltage, successively obtaining a current minimum delay value for the semiconductor memory under a third current reference voltage and a current minimum delay value for the semiconductor memory under a reference voltage prior to the third current reference voltage until a third preset condition is met; and determining the current minimum delay value under the third current reference voltage as the maximum value in the third target search interval in response to the third preset condition being that the current minimum delay value under the third current reference voltage is no less than the current minimum delay value under the reference voltage prior to the third current reference voltage.

14. The semiconductor memory training method according to claim 13, wherein searching for, in the third target search interval, the maximum value among the current minimum delay values for the semiconductor memory further comprises:

determining the current minimum delay value under the minimum reference voltage in the third target search interval as the maximum value in the third target search interval in response to the third preset condition being that the current minimum delay value under the third current reference voltage is less than the current minimum delay value under the reference voltage prior to the third current reference voltage and the reference voltage prior to the third current reference voltage is the minimum reference voltage in the third target search interval.

15. The semiconductor memory training method according to claim 10, further comprising:
determining an interval between the historical expected voltage and a maximum reference voltage in the current training voltage range as a fourth target search interval in response to the current minimum delay value under the reference voltage prior to the historical expected voltage being less than the delay threshold and the current minimum delay value under the reference voltage prior to the historical expected voltage being less than the current minimum delay value under the historical expected voltage; and
using a current minimum delay value under a fourth reference voltage as the current expected delay value in response to finding in the fourth target search interval that the current minimum delay value for the semiconductor memory under the fourth reference voltage is no less than the delay threshold.

16. The semiconductor memory training method according to claim 15, further comprising:
searching for, in the fourth target search interval, a maximum value among current minimum delay values for the semiconductor memory; and
using the stored historical training result as the current training result of the semiconductor memory in response to the maximum value in the fourth target search interval being less than the delay threshold.

17. A non-transitory computer-readable storage medium, having computer programs stored thereon that, in repsonse to the computer programs being executed by processors, the processors implement a semiconductor memory training method, wherein a semiconductor memory has a plurality of reference voltages, and the semiconductor memory training method comprises:
starting from a minimum reference voltage among the plurality of reference voltages, successively obtaining a historical minimum delay value for the semiconductor memory under a first current reference voltage and a historical minimum delay value for the semiconductor memory under a reference voltage next to the first current reference voltage until a first preset condition is met;
determining the historical minimum delay value under the first current reference voltage as a historical expected delay value in response to the first preset condition being that the historical minimum delay value under the first current reference voltage is no less than the historical minimum delay value under the reference voltage next to the first current reference voltage;
storing the historical expected delay value and a historical expected voltage as a stored historical training result of the semiconductor memory; and
upon detecting at least one of a change in an operating temperature of the semiconductor memory or an operating voltage of the semiconductor memory:
obtaining the stored historical training result of the semiconductor memory, the stored historical training result comprising the historical expected delay value and the historical expected voltage;
setting a delay threshold and a current training voltage range, the delay threshold being less than or equal to the historical expected delay value, the current training voltage range comprising the historical expected voltage;
obtaining a current minimum delay value for the semiconductor memory under the historical expected voltage; and
training the semiconductor memory using the stored historical training result as a current training result of the semiconductor memory in response to the current minimum delay value for the semiconductor memory under the historical expected voltage being no less than the delay threshold.

18. A semiconductor memory training apparatus, wherein a semiconductor memory has a plurality of reference voltages, and the semiconductor memory training apparatus comprises:
one or more processors; and
a storage apparatus, configured to store one or more programs;
in response to the one or more programs being executed by the one or more processors, the one or more processors implement:
starting from a minimum reference voltage among the plurality of reference voltages, successively obtaining a historical minimum delay value for the semiconductor memory under a first current reference voltage and a historical minimum delay value for the semiconductor memory under a reference voltage next to the first current reference voltage until a first preset condition is met;
determining the historical minimum delay value under the first current reference voltage as a historical expected delay value in response to the first preset condition being that the historical minimum delay value under the first current reference voltage is no less than the historical minimum delay value under the reference voltage next to the first current reference voltage;
storing the historical expected delay value and a historical expected voltage as a stored historical training result of the semiconductor memory; and
upon detecting at least one of a change in an operating temperature of the semiconductor memory or an operating voltage of the semiconductor memory:
obtaining the stored historical training result, the stored historical training result comprising the historical expected delay value and the historical expected voltage;
setting a delay threshold and a current training voltage range, the delay threshold being less than or equal to the historical expected delay value, the current training voltage range comprising the historical expected voltage;
obtaining a current minimum delay value for the semiconductor memory under the historical expected voltage; and
training the semiconductor memory using the stored historical training result as a current training result of the semiconductor memory in response to the current minimum delay value under the historical expected voltage is no less than the delay threshold.

* * * * *